United States Patent
Housley et al.

(10) Patent No.: US 10,756,022 B2
(45) Date of Patent: Aug. 25, 2020

(54) METHODS OF ALIGNMENT MARKING SEMICONDUCTOR WAFERS, AND SEMICONDUCTOR PACKAGES HAVING PORTIONS OF ALIGNMENT MARKINGS

(71) Applicant: Micron Technology, Inc., Boise, ID (US)

(72) Inventors: Richard T. Housley, Boise, ID (US); Jianming Zhou, Liaoning (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/554,118

(22) Filed: Aug. 28, 2019

(65) Prior Publication Data
US 2020/0075500 A1    Mar. 5, 2020

Related U.S. Application Data

(63) Continuation of application No. 16/118,902, filed on Aug. 31, 2018, now Pat. No. 10,461,038.

(51) Int. Cl.
*H01L 21/00*    (2006.01)
*H01L 23/544*    (2006.01)
*H01L 21/78*    (2006.01)

(52) U.S. Cl.
CPC ............ *H01L 23/544* (2013.01); *H01L 21/78* (2013.01); *H01L 2223/5442* (2013.01); *H01L 2223/5446* (2013.01); *H01L 2223/54426* (2013.01)

(58) Field of Classification Search
CPC ........... H01L 23/544; H01L 2223/5446; H01L 2223/54453; H01L 27/14632; H01L 2224/8313; H01L 2224/8113; H01L 21/68
(Continued)

(56) References Cited

U.S. PATENT DOCUMENTS 7,126,231 B2 * 10/2006 Koike ................. G03F 1/20
257/797
8,361,876 B2 * 1/2013 Ishimaru ................. G03F 9/708
257/797

(Continued)

FOREIGN PATENT DOCUMENTS

JP    2007-273727    10/2007
JP    2009-302309    12/2009

OTHER PUBLICATIONS

WO PCT/US2019/047338 Search Rept., dated Dec. 6, 2019, Micron Technology, Inc.

(Continued)

*Primary Examiner* — S. V. Clark
(74) *Attorney, Agent, or Firm* — Wells St. John P.S.

(57) ABSTRACT

Some embodiments include a semiconductor package. The semiconductor package has a semiconductor die with a primary region which includes integrated circuitry, and with an edge region which includes a portion of an alignment mark location. The portion of the alignment mark location includes a segment of an alignment mark. The alignment mark includes a pattern of lines and spaces, with the lines extending along a first direction. The portion of the alignment mark location also includes a texture having a pattern other than lines extending along either the first direction or along a second direction substantially orthogonal to the first direction. Some embodiments include methods for alignment marking semiconductor wafers.

19 Claims, 21 Drawing Sheets

(58) Field of Classification Search
USPC .................................. 438/460, 462; 257/797
See application file for complete search history.

(56) References Cited

U.S. PATENT DOCUMENTS

| | | | | |
|---|---|---|---|---|
| 2001/0028457 | A1* | 10/2001 | Matsuura | G03F 9/7076 |
| | | | | 356/401 |
| 2002/0093110 | A1* | 7/2002 | Fujimoto | G03F 9/7076 |
| | | | | 257/797 |
| 2003/0174879 | A1* | 9/2003 | Chen | G03F 7/70633 |
| | | | | 382/151 |
| 2009/0269862 | A1* | 10/2009 | Tanemura | H01L 22/20 |
| | | | | 438/7 |
| 2009/0312981 | A1 | 12/2009 | Saito | |
| 2018/0130845 | A1* | 5/2018 | Ko | H01L 27/14685 |
| 2019/0067204 | A1* | 2/2019 | Sun | G01B 21/24 |
| 2019/0146357 | A1* | 5/2019 | Wang | H01L 21/0274 |
| | | | | 430/22 |
| 2019/0164919 | A1* | 5/2019 | Hu | H01L 24/80 |

OTHER PUBLICATIONS

WO PCT/US2019/047338 Writ. Opin., dated Dec. 6, 2019, Micron Technology, Inc.

\* cited by examiner

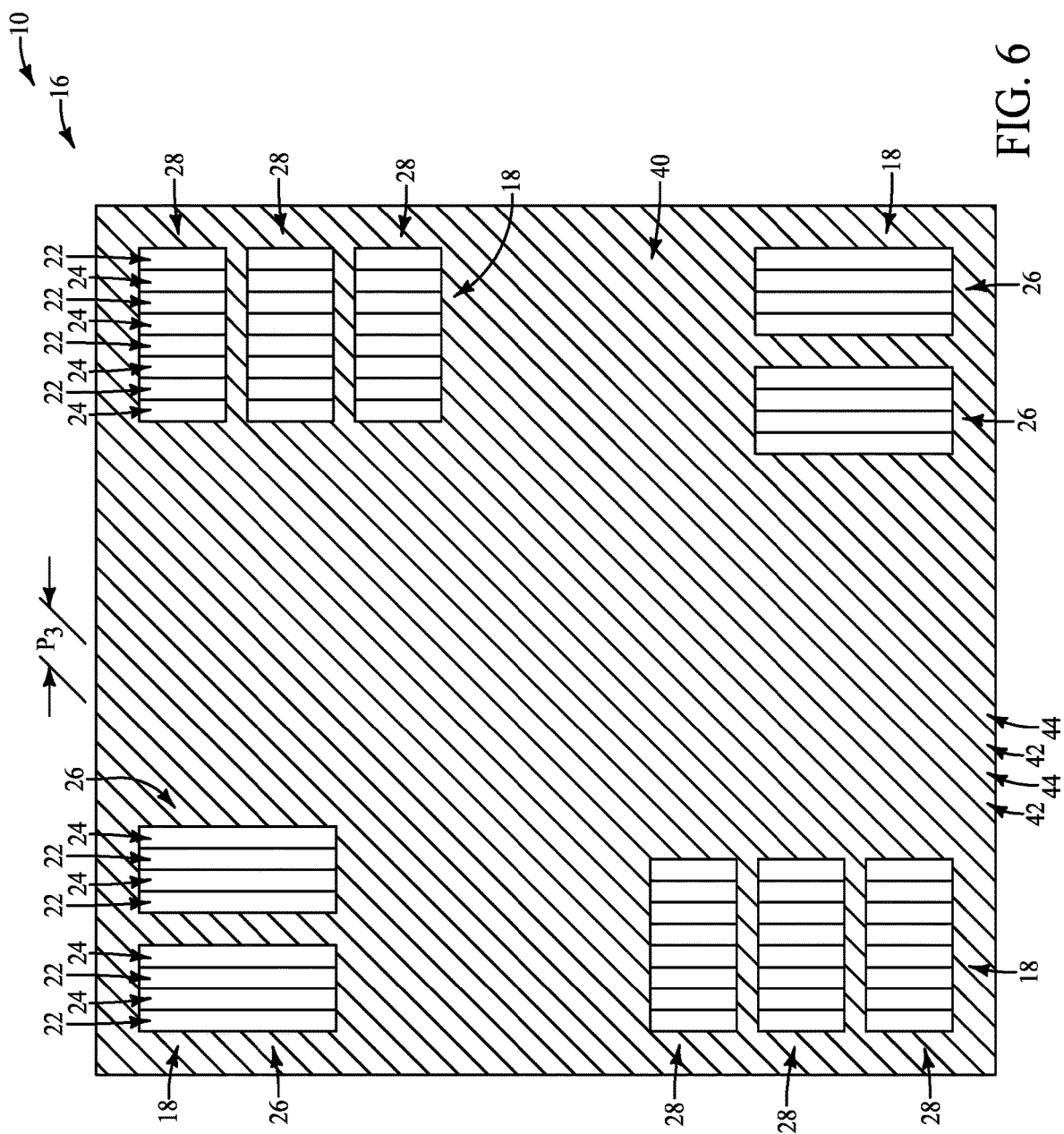
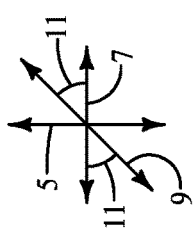
FIG. 6

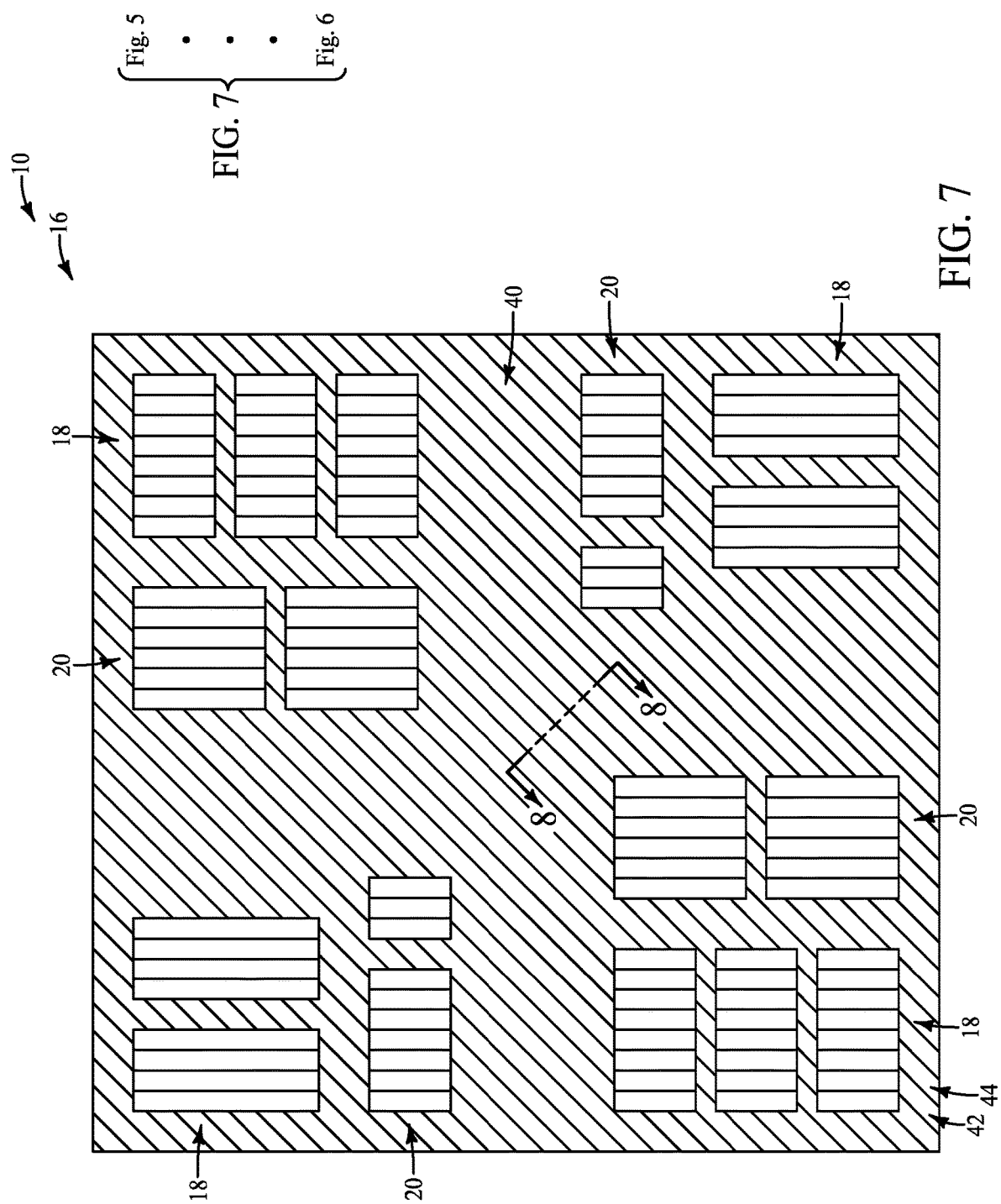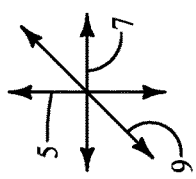

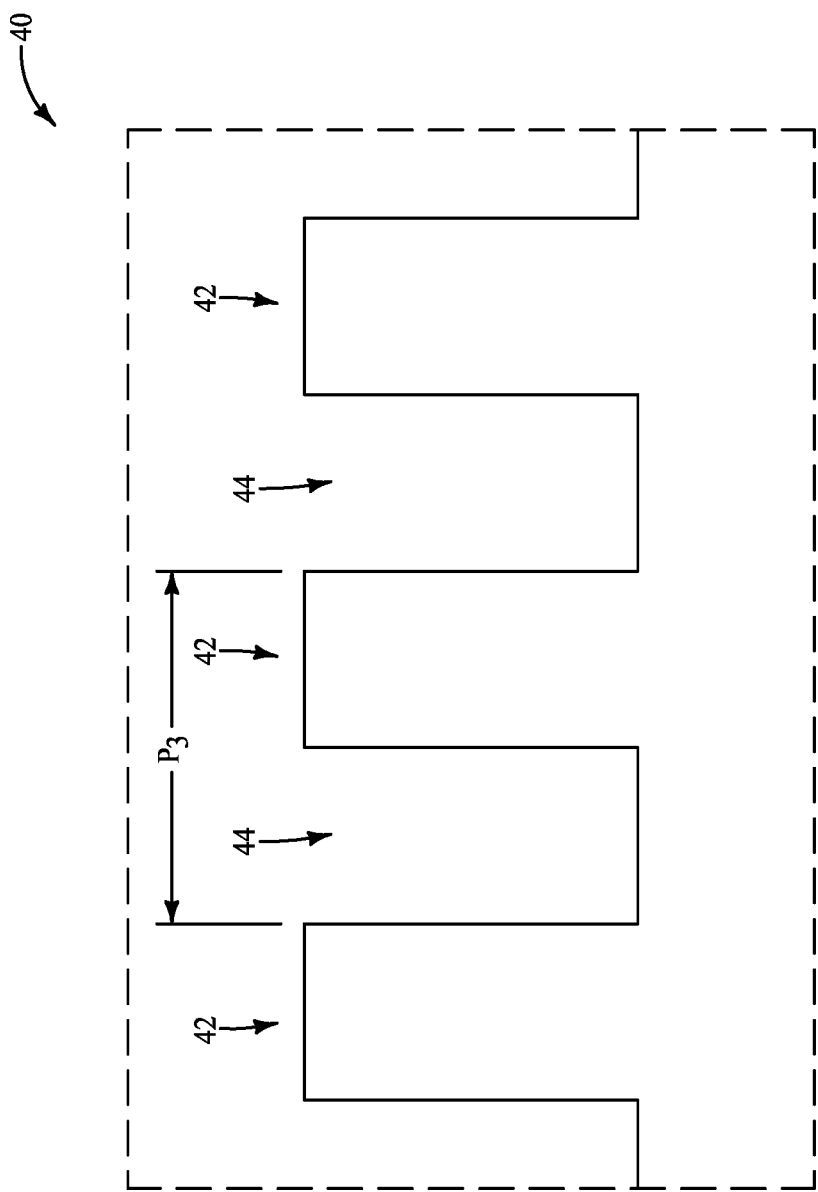

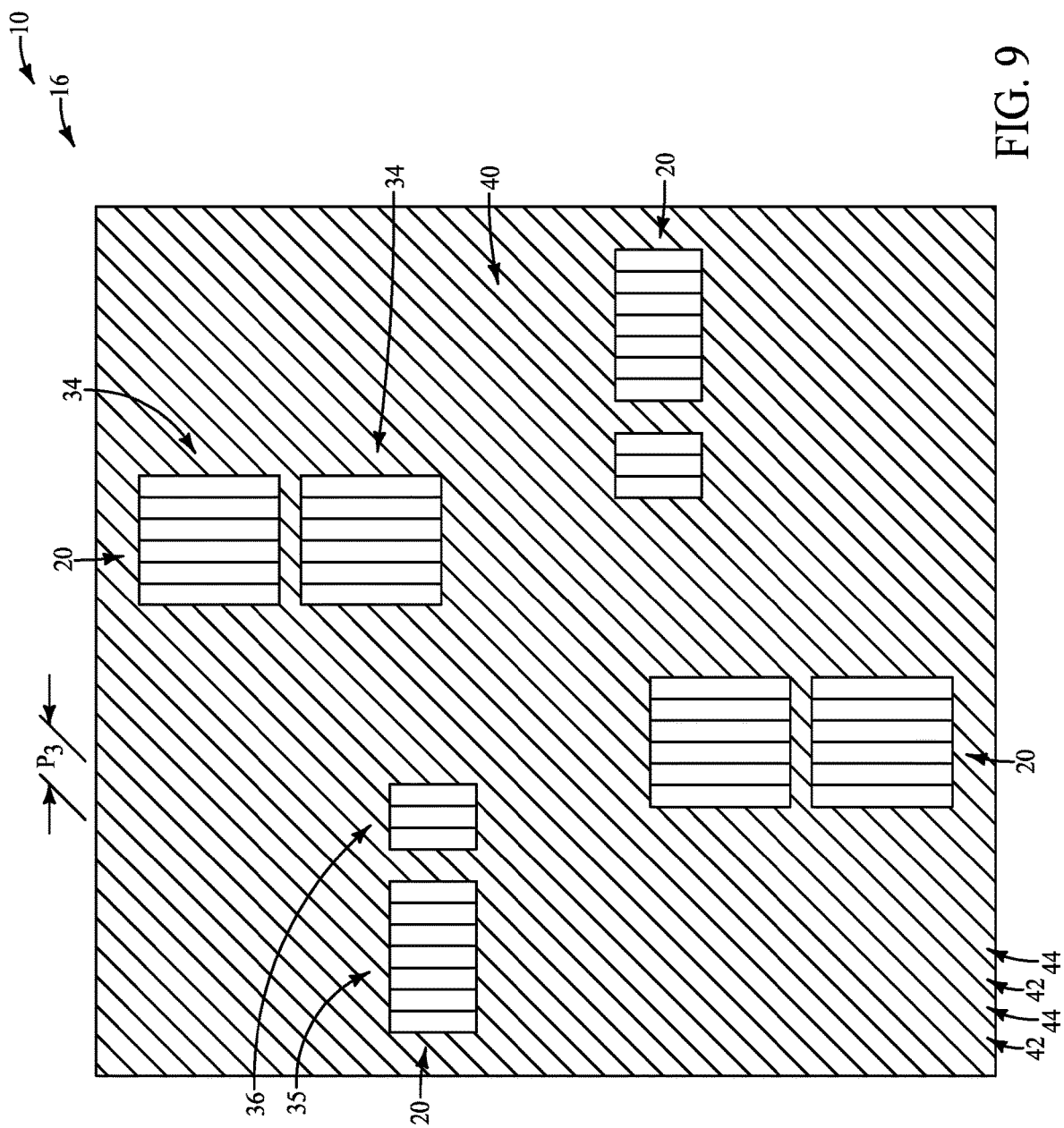
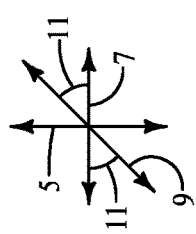
FIG. 9

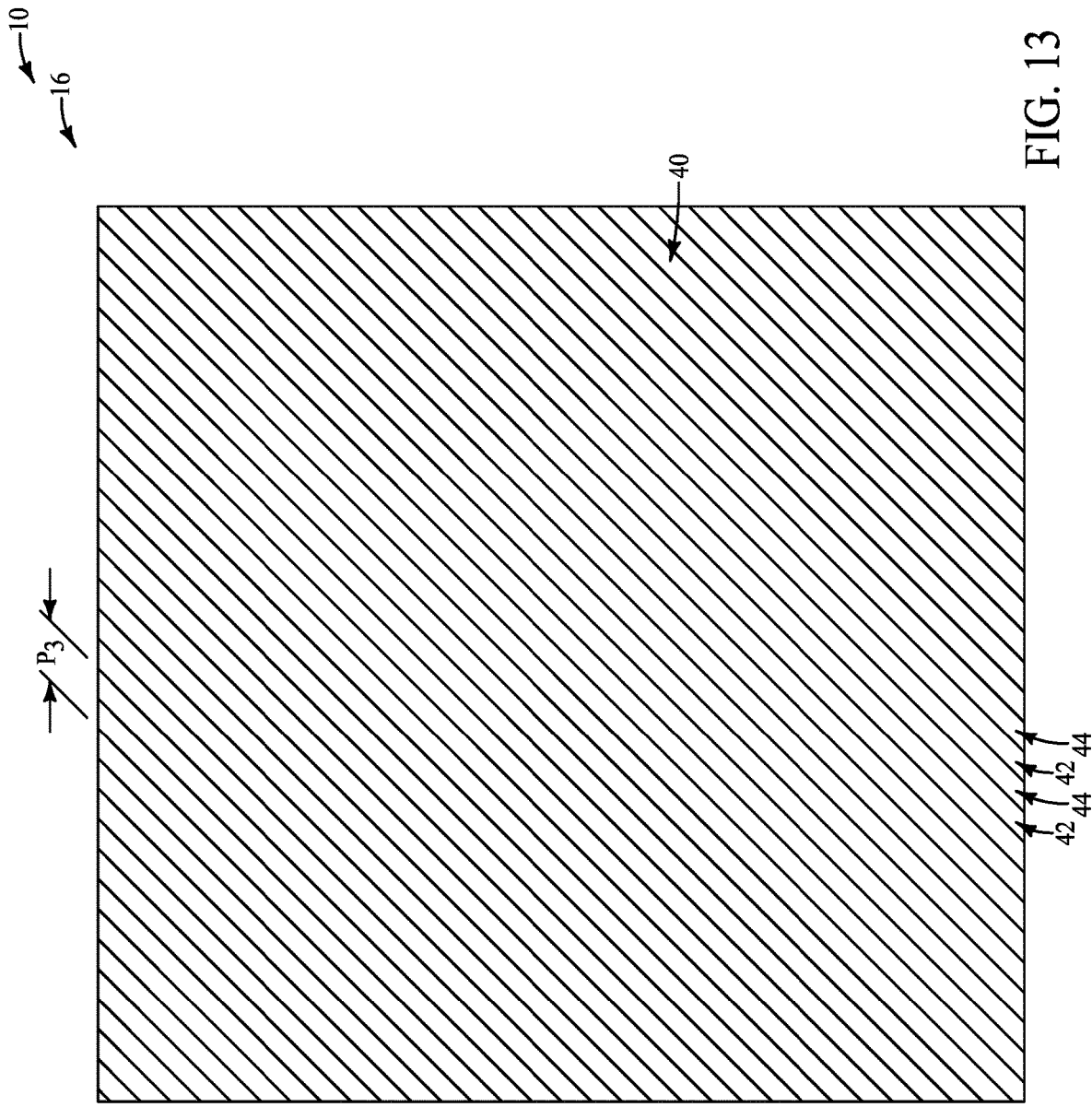
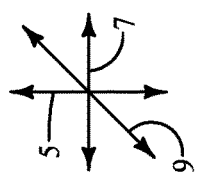
FIG. 13

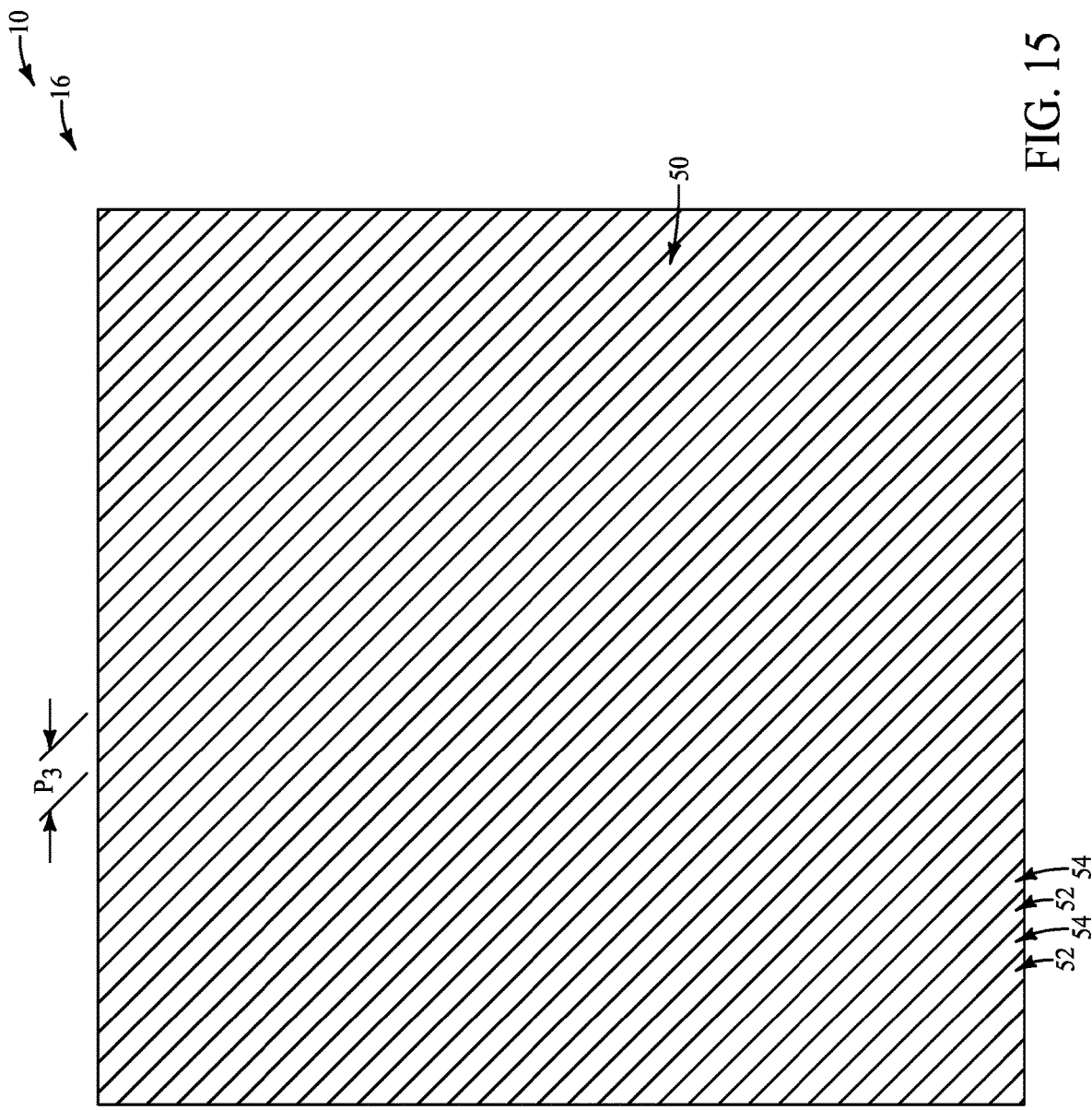
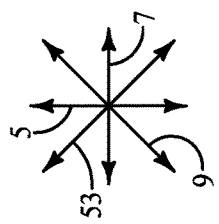
FIG. 15

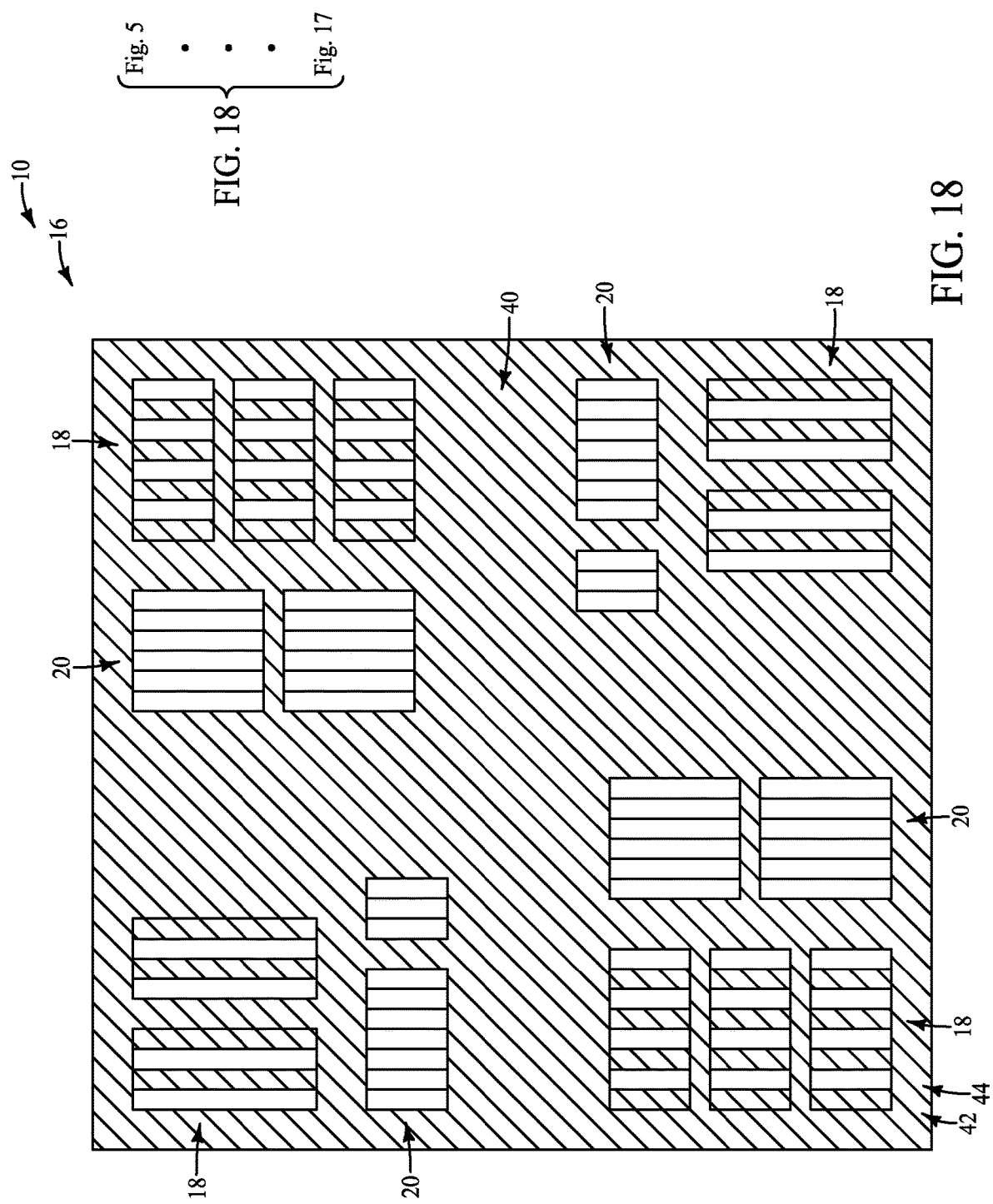
FIG. 18
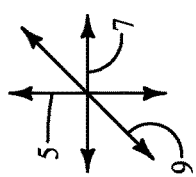

METHODS OF ALIGNMENT MARKING SEMICONDUCTOR WAFERS, AND SEMICONDUCTOR PACKAGES HAVING PORTIONS OF ALIGNMENT MARKINGS

RELATED PATENT DATA

This patent resulted from a continuation of U.S. patent application Ser. No. 16/118,902 filed Aug. 31, 2018 which is hereby incorporated by reference herein.

TECHNICAL FIELD

Methods of alignment marking semiconductor wafers, and semiconductor packages having portions of alignment markings.

BACKGROUND

Semiconductor devices may include integrated circuitry; such as, for example, integrated memory, integrated logic, integrated sensors, etc. Fabrication of the integrated circuitry often involves complex processing steps. During the manufacture of integrated circuitry, many layers of different materials may be applied one atop another. These layers must be accurately registered to ensure proper operation of the semiconductor device. If the layers are not properly aligned, the device may not perform well, or may be inoperative.

To aid in the registration of overlying layers in semiconductor devices, alignment marks (i.e., registration marks) are included in various layers during fabrication. The alignment marks have a predetermined relationship when they are correctly registered. A reticle is used to pattern the appropriate marks on a particular wafer process layer.

A problem encountered during the utilization of alignment marks is that some of the process steps utilized for fabrication of integrated circuitry may undesirably modify the alignment marks. For instance, chemical-mechanical polishing (CMP) may be utilized as a process step during fabrication of integrated circuitry. The polishing may problematically remove portions of the alignment marks in polished layers. Such modifies the alignment marks, leading to difficulties in subsequently utilizing the alignment marks to achieve appropriate registration relative to other layers stacked over the polished layers. It would be desirable to develop methods and structures which overcome such problem.

BRIEF DESCRIPTION OF THE DRAWINGS

FIG. 6 is a diagrammatic top-down view of an alignment mark location associated with a semiconductor wafer, and illustrates example alignment marks and an example texture.

FIG. 7 is a diagrammatic top-down view of an alignment mark location associated with a semiconductor wafer. A description adjacent the alignment mark location diagrammatically indicates that the marks and texture of FIG. 7 may result from the overlay of alignment marks from FIG. 5 with the alignment marks and texture of FIG. 6.

FIG. 8 is a diagrammatic cross-sectional side view of example lines that may be utilized in an example texture. FIG. 8 is along a line 8-8 of FIG. 7.

FIG. 9 is a diagrammatic top-down view of an alignment mark location associated with a semiconductor wafer, and illustrates example alignment marks and an example texture.

FIG. 13 is a diagrammatic top-down view of an alignment mark location associated with a semiconductor wafer, and illustrates an example texture.

FIG. 15 is a diagrammatic top-down view of an alignment mark location associated with a semiconductor wafer, and illustrates an example texture.

FIG. 18 is a diagrammatic top-down view of an alignment mark location associated with a semiconductor wafer. A description adjacent the alignment mark location diagrammatically indicates that the marks and texture of FIG. 18 may result from the overlay of alignment marks from FIG. 5 with the alignment marks and texture of FIG. 17.

DETAILED DESCRIPTION OF THE ILLUSTRATED EMBODIMENTS

Some embodiments include recognition that polishing processes (e.g., CMP) are generally intended to planarize surfaces across relatively consistent underlying textures. For instance, integrated circuitry may comprise lines and spaces along a consistent pitch, and an overlying material may be provided over the lines and spaces. Polishing processes may then be utilized to remove some of the overlying material and form a planarized surface extending across the lines and spaces. The alignment marks are provided in alignment mark locations, and such locations lack underlying textures similar to those associated with the integrated circuitry. Accordingly, the alignment mark locations may be particularly prone to dishing and/or other problematic behavior during polishing processes; with such problematic behaviors removing portions of the alignment marks. Some embodiments include recognition that the problematic behaviors encountered during the polishing processes may be alleviated, or even prevented, by providing textures within the alignment mark locations which are reasonably consistent with the textures associated with integrated circuitry during a polishing process. Example embodiments are described with reference to FIG. 1-21.

Figure 1:
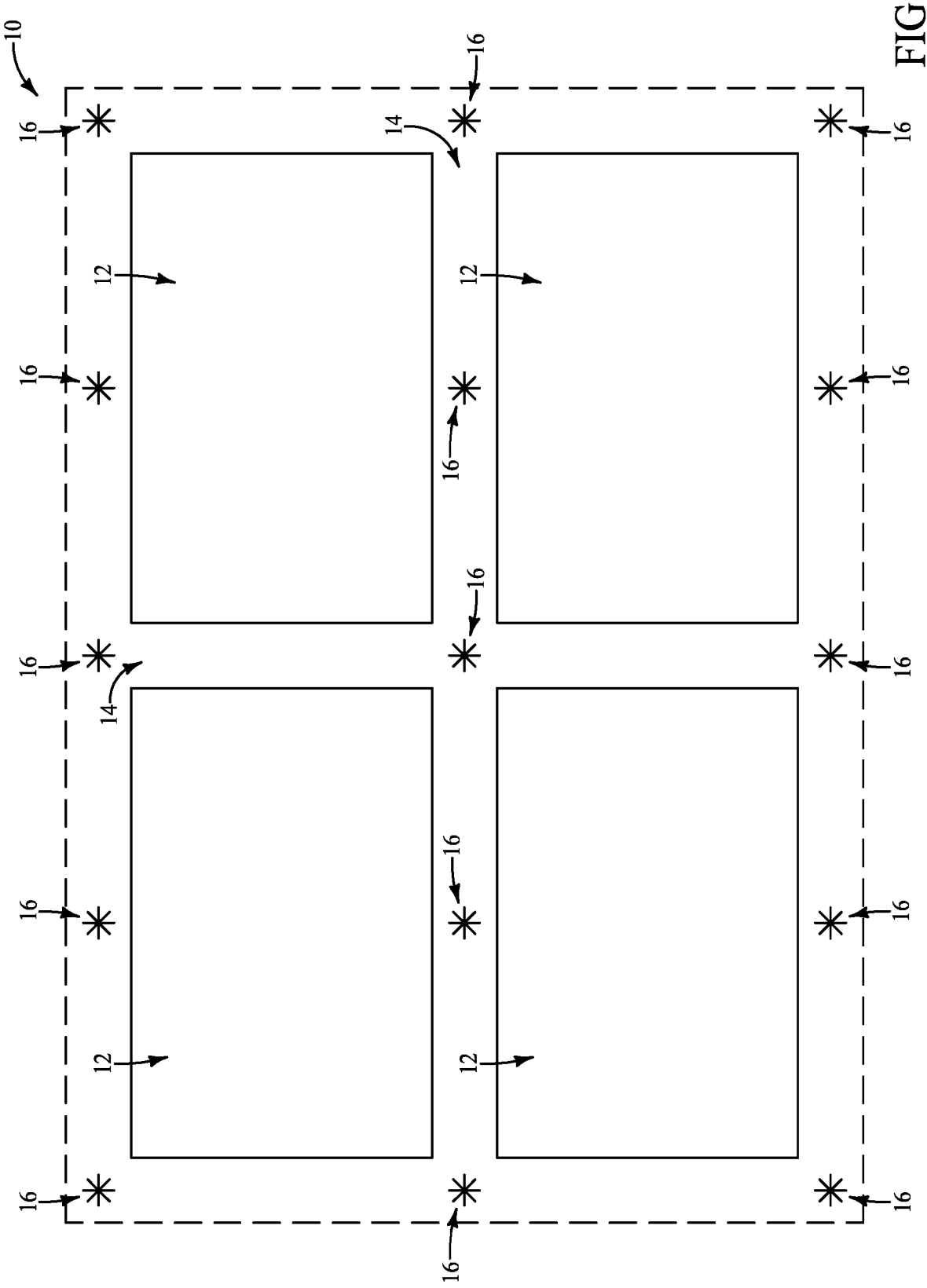
FIG. 1 is a diagrammatic top-down view of a region of a semiconductor wafer.

Referring to FIG. 1, a portion of a semiconductor wafer 10 is illustrated. Such portion comprises die locations 12 where integrated circuitry will be formed. The die locations are spaced from one another by intervening regions 14. Alignment mark locations (i.e., registration mark locations) 16 are within the intervening regions.

The semiconductor wafer may comprise any suitable semiconductor material; and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor wafer may comprise monocrystalline silicon.

The die locations 12 may be considered to be locations which are defined along the semiconductor wafer, and where integrated circuitry will be fabricated. The alignment mark locations 16 may be considered to be locations which are defined for formation of alignment marks. The die locations 12 may have any suitable shapes; and in the shown embodiment are indicated to be rectangular. The alignment mark locations may be provided in any suitable relationships relative to the die locations; and in the shown embodiment are provided adjacent corners and edges of the die locations.

Figure 2:
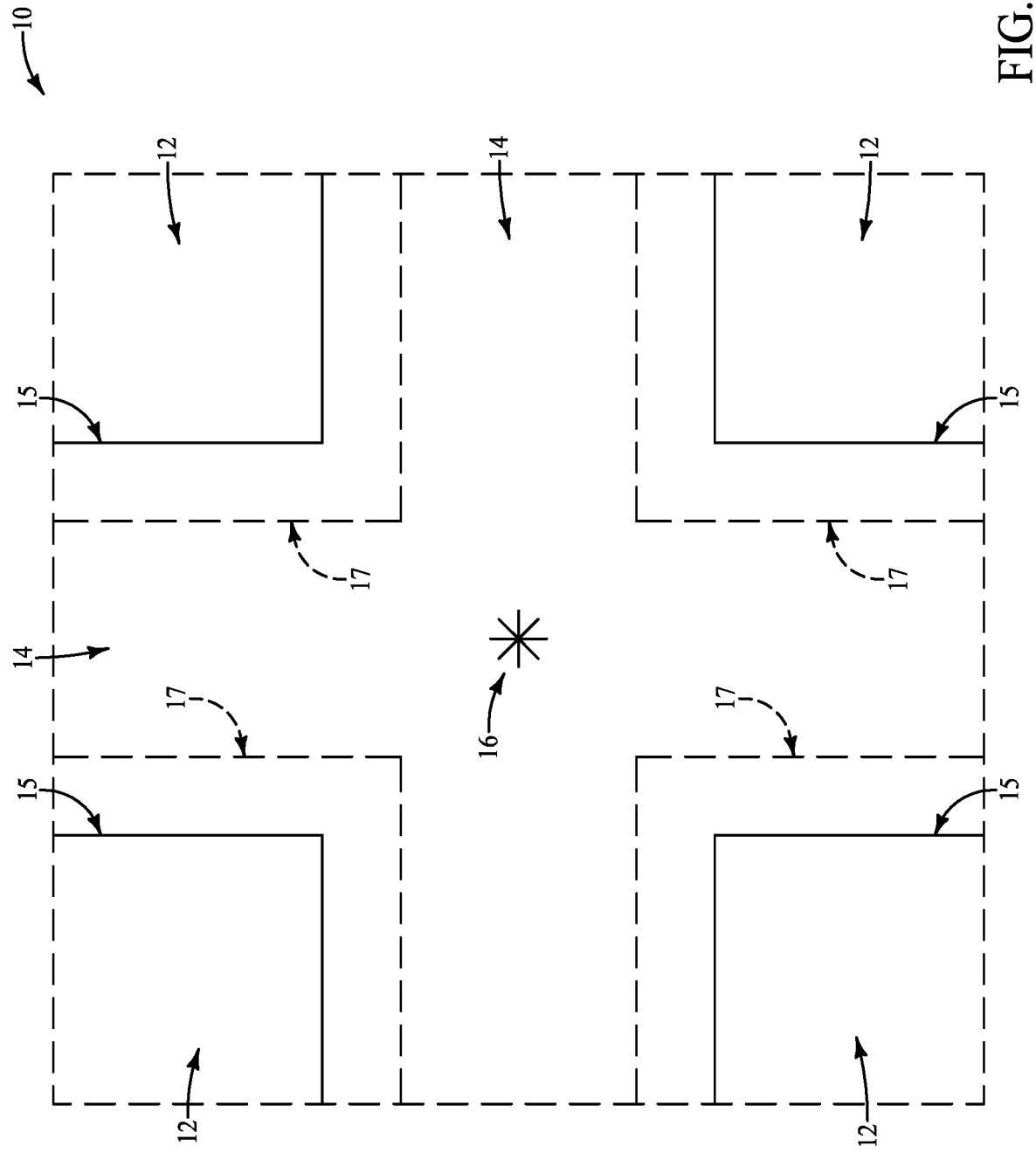
FIG. 2 is a diagrammatic top-down view of a portion of the semiconductor wafer of FIG. 1.

FIG. 2 shows an enlarged view of a region of the semiconductor wafer 10. An alignment mark location 16 is proximate corners of four die locations 12. Each of the die locations 12 has an outer periphery 15 which diagrammatically represents an edge of the functional integrated circuitry ultimately fabricated in the die locations. Patterns associated with the integrated circuitry (for instance, line and space patterns associated with wordlines, digit lines, etc.) may extend beyond the outer peripheries 15. Dashed lines are provided to diagrammatically illustrate secondary peripheries 17 which may be associated with the die locations 12, and which may comprise patterns associated with the integrated circuitry.

The alignment mark location 16 is within an open expanse beyond the outer peripheries 15 and beyond the secondary peripheries 17. Accordingly, the alignment mark location does not include any texture associated with patterns formed within the die locations 12. As discussed above, some embodiments include recognition that it may be advantageous to provide a texture across an alignment mark location in order to alleviate problems associated with polishing processes. Such embodiments will be described in more detail below relative to FIG. 6-19.

Figures 3, 3A:
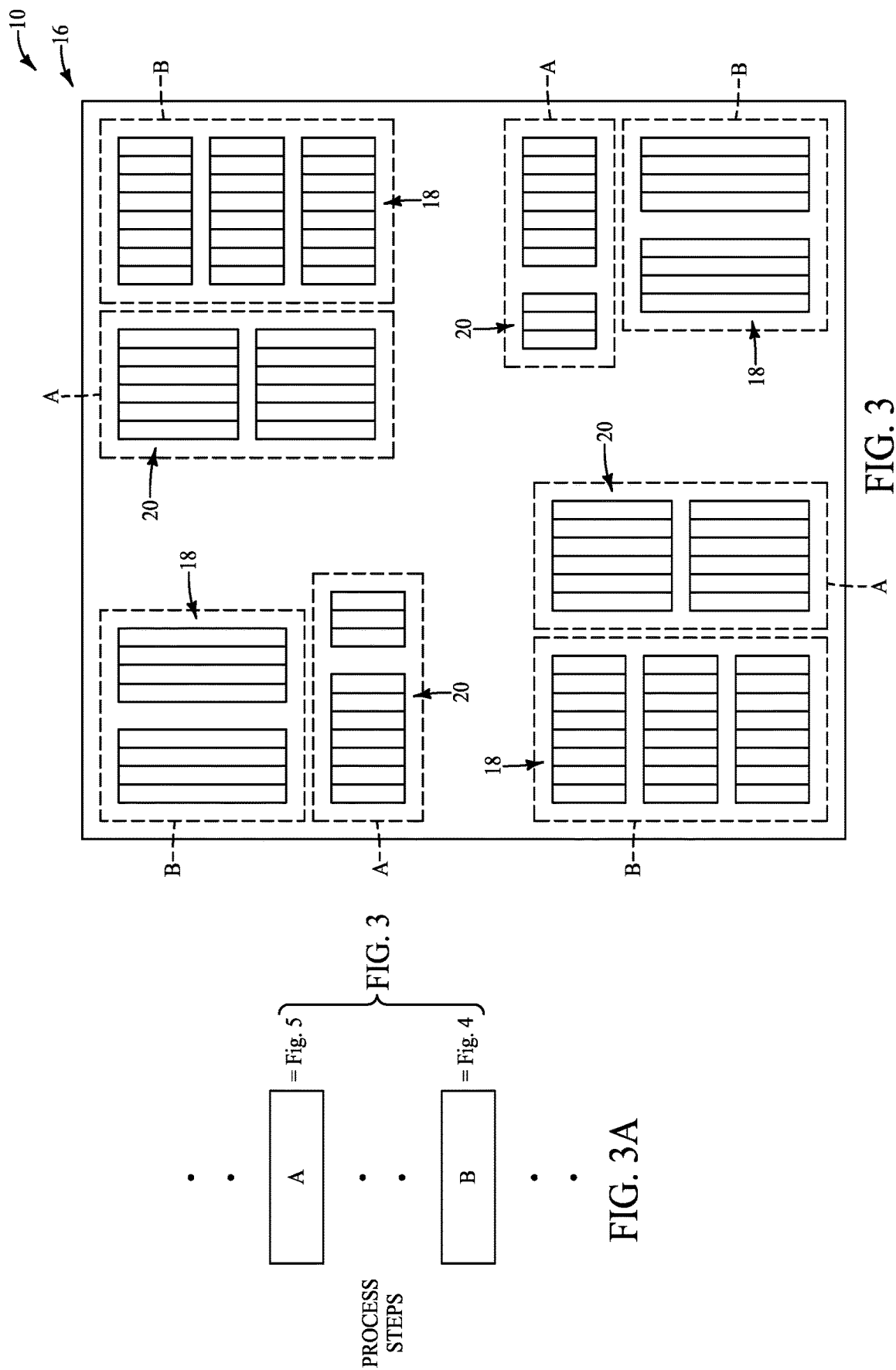
FIG. 3 is a diagrammatic top-down view of an alignment mark location associated with a semiconductor wafer.
FIG. 3A is a diagrammatic representation of a process order which may be associated with the formation of alignment marks in the alignment mark location of FIG. 3, and also diagrammatically indicates that the marks of FIG. 3 may result from the overlay of alignment marks from FIG. 5 with those of FIG. 4.
Figure 4:
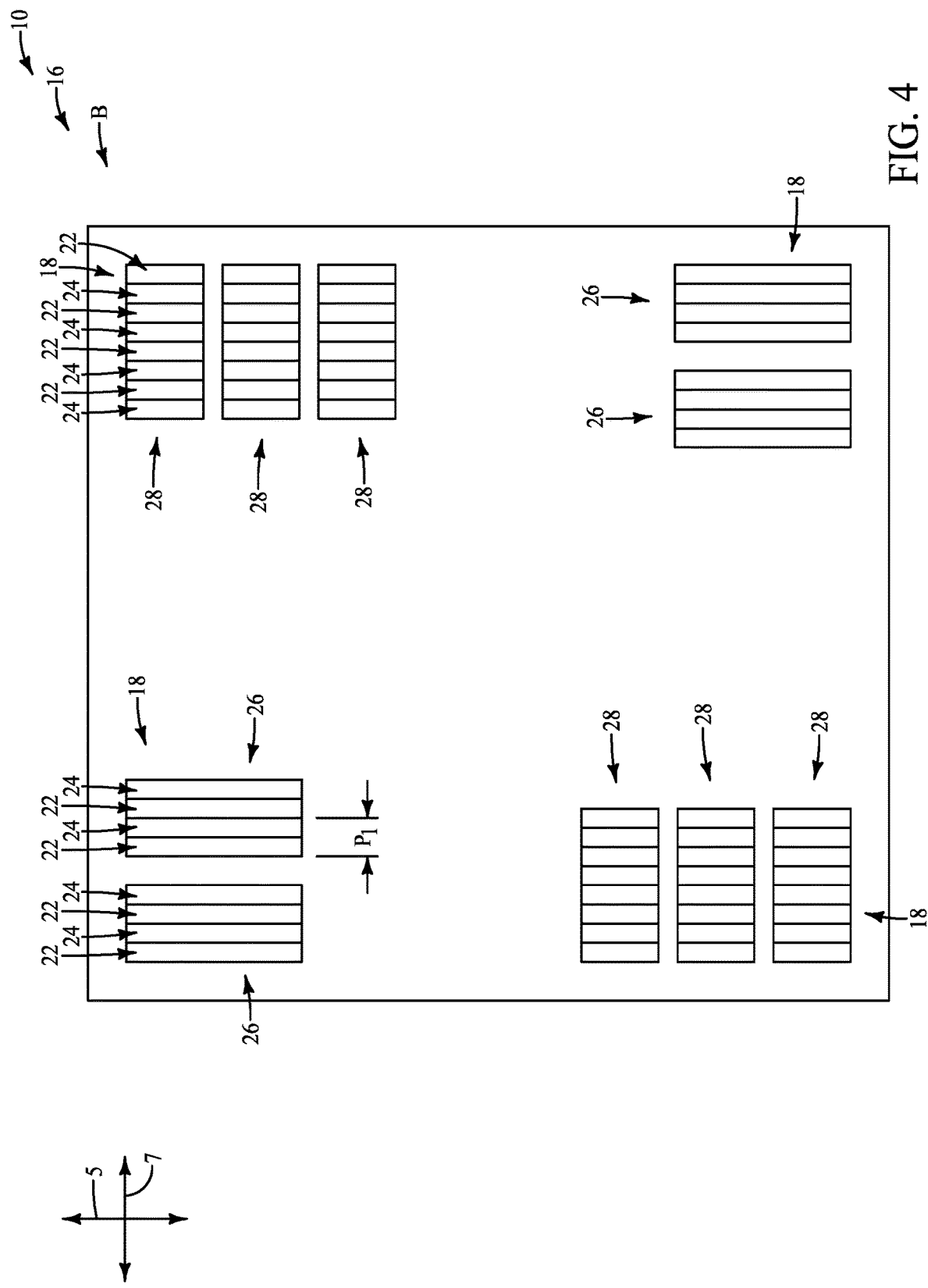
FIG. 4 is a diagrammatic top-down view of an alignment mark location associated with a semiconductor wafer, and illustrates example alignment marks.
Figure 5:
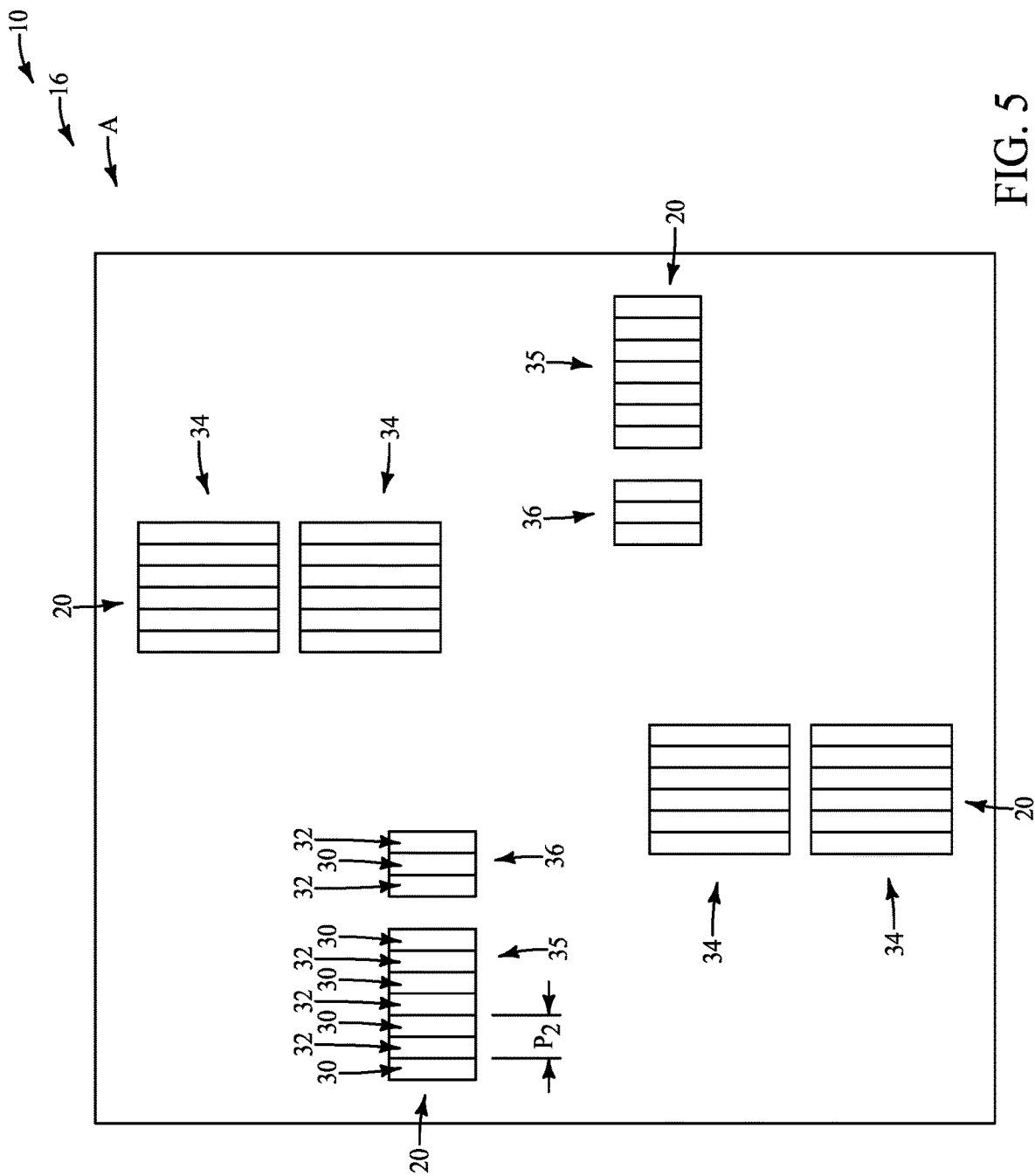
FIG. 5 is a diagrammatic top-down view of an alignment mark location associated with a semiconductor wafer, and illustrates example alignment marks.

Referring to FIG. 3-5 example alignment marks are illustrated relative to an example alignment mark location 16. The alignment marks include a first set 18 from an earlier process step "B" (where "B" may be considered to correspond to a Bottom layer within an indicated sequence of process steps), and include a second set 20 from a later process step "A". FIG. 3A diagrammatically illustrates the relative order of the process steps "A" and "B". It is noted that there may be one or more intermediate process steps between steps "A" and "B", there may be process steps earlier than the process step "B", and there may be process steps subsequent to the process step "A". Additional alignment marks (not shown) may be associated with one or more of the additional process steps.

In some embodiments, the alignment marks 18 may be referred to as first alignment marks which are formed within the alignment mark locations 16 at a first level of processing associated with the semiconductor wafer 10 (the "first" level at which the alignment marks 18 are formed is an earliest level for purposes of comparison to other levels described herein, and may or may not be the earliest level when considered in light of a total process sequence). In some embodiments, the alignment marks 20 may be referred to as second alignment marks which are formed within the alignment mark locations 16 at a second level of processing which is subsequent to the first level of processing.

FIGS. 4 and 5 show the first alignment marks 18 (FIG. 4) and the second alignment marks 20 (FIG. 5) in isolation from one another.

Referring to FIG. 4, the first alignment marks 18 are shown to comprise a pattern of lines 22 and spaces 24 (with only some of the lines and spaces 22 and 24 being labeled). The lines and spaces 22 and 24 may be referred to as first lines and first spaces, respectively; and the pattern of such lines and spaces may be referred to as a first pattern.

The lines 22 extend primarily along a first direction represented by an axis 5 (the axis 5 is shown adjacent the top-down view of FIG. 4). The lines 22 are indicated to extend "primarily" along the axis 5 to indicate that the lines may be wavy or curved in some embodiments, but that the general direction of the lines is along the axis 5.

The lines and spaces 22 and 24 are on a pitch "$P_1$". The lines and spaces 22 and 24 may all be on a substantially uniform pitch (as shown) in some embodiments, and in other embodiments some of the lines and spaces 22 and 24 may be on a different pitch than others of the lines and spaces 22 and 24.

The pattern of the lines and spaces 22 and 24 is shown to be subdivided amongst segments 26 and 28 in the embodiment of FIG. 4; with the segments 26 extending primarily along the first direction represented by the axis 5, and with the segments 28 extending primarily along a second direction represented by an axis 7. In the shown embodiment, the second direction represented by the axis 7 is substantially orthogonal to the first direction represented by the axis 5 (with the term "substantially orthogonal" meaning orthogonal to within reasonable tolerances of fabrication and measurement).

The segments 26 and 28 may be referred to as first and second segments, respectively.

In the shown embodiment, the pattern of lines and spaces 22 and 24 is subdivided amongst multiple types of segments 26 and 28. In other embodiments, all of the segments may be substantially identical to one another.

Referring to FIG. 5, the second alignment marks 20 are shown to comprise a pattern of lines 30 and spaces 32 (with only some of the lines and spaces 30 and 32 being labeled). The lines and spaces 30 and 32 may be referred to as second lines and second spaces, respectively; and the pattern of such lines and spaces may be referred to as a second pattern.

The lines 30 extend primarily along the first direction (represented by the axis 5). The lines and spaces 30 and 32 are on a pitch "$P_2$". The lines and spaces 30 and 32 may all be on a substantially uniform pitch (as shown) in some embodiments, and in other embodiments some of the lines and spaces 30 and 32 may be on a different pitch than others of the lines and spaces 30 and 32. The pitch $P_2$ may be substantially the same as the pitch $P_1$ (FIG. 4) in some embodiments, and may be different than the pitch $P_1$ in other embodiments. The term "substantially the same" means the same to within reasonable tolerances of fabrication and measurement.

The pattern of the lines and spaces 30 and 32 is shown to be subdivided amongst segments 34, 35 and 36 in the embodiment of FIG. 5; with the segments 34 and 36 extending primarily along the first direction represented by the axis 5, and with the segments 35 extending primarily along the second direction represented by the axis 7.

The segments 34, 35 and 36 may be referred to as third, fourth and fifth segments, respectively.

In the shown embodiment, the pattern of lines and spaces 30 and 32 is subdivided amongst multiple types of segments. In other embodiments, all of the segments may be substantially identical to one another.

The alignment marks 18 and 20 of FIGS. 4 and 5 may be formed with any suitable processing. For instance, reticles may be configured to pattern the alignment marks. The same reticles may be utilized for the processing stages "A" and "B" so that the alignment marks are registered relative to patterns formed across the die locations 12 (FIG. 1). The lines 22 of FIG. 4 and the lines 30 of FIG. 5 may be formed within any suitable material(s). In some embodiments, one or both of the lines 22 and 30 may be formed within photoresist. In some embodiments, one or both of the lines 22 and 30 may extend into one or more of semiconductor material (e.g., silicon), insulative material (e.g., silicon dioxide), and conductive material (e.g., metal).

FIG. 3 shows the alignment marks 20 of process stage "A" adjacent to the alignment marks 18 of process stage "B". The alignment marks 20 may be compared with the alignment marks 18 to determine if patterning associated with process stage "A" is appropriately registered relative to patterning associate with process stage "B". FIG. 3 illustrates an idealized situation in which the alignment marks 18 at the process stage of FIG. 3 are identical to those formed at the earlier process stage of FIG. 4. However, as discussed above, intermediate process stages between the process stages "B" and "A" may undesirably modify the alignment marks 18. For instance, if an intermediate process stage utilizes a polishing process, the alignment marks 18 may be modified through dishing and/or other undesired effects of the polishing process.

FIGS. 6 and 7 illustrate an example process which may alleviate or prevent problematic modification of the alignment marks 18 during intermediate process stages between the process stages "B" and "A" of FIG. 3.

FIG. 6 shows the alignment mark location 16 at a process stage analogous to that described above with reference to FIG. 4. However, a texture 40 has been formed across the alignment mark location 16. The texture 40 comprises a pattern across the expanse of the alignment mark location. Such texture may alleviate or prevent the problems described above relative to process stages undesirably modifying the alignment marks 18. Specifically, the texture 40 may be reasonably similar to a texture formed across the die locations 12 (FIG. 1) so that subsequent process stages do not problematically alter the alignment mark location 16 (e.g., so that subsequent polishing stages do not problematically dish into the die location).

The texture 40 has a pattern other than lines extending along either the first direction (represented by the axis 5) or the second direction (represented by the axis 7). The texture 40 may be any suitable pattern, including, for example, patterns of openings, cavities, pillars, etc., extending across the die location. In the illustrated embodiment, the texture 40 is a pattern of lines 42 and spaces 44 (only some of which are labeled). The lines and spaces 42 and 44 may be referred to as third lines and third spaces, respectively, to distinguish them from the first and second lines and spaces (22, 24, 30 and 32) of the alignment marks 18 and 20 (described above with reference to FIGS. 4 and 5). The pattern 40 formed from the lines and spaces 42 and 44 may be referred to as a third pattern to distinguish it from the first pattern of lines and spaces 22 and 24 (described above with reference to FIG. 4), and the second pattern of lines and spaces 30 and 32 (described above with reference to FIG. 5). In other embodiments, the pattern 40 may be referred to as a second pattern to simply distinguish it from the first pattern of lines and spaces 22 and 24 (FIG. 4); and in such embodiments the lines and spaces 42 and 44 may be referred to as second lines and spaces.

The lines 42 extend along a third direction (represented by an axis 9) which crosses the first and second directions (represented by the axes 5 and 7). In the illustrated embodiment the third direction (represented by the axis 9) crosses the first and second directions (represented by the axes 5 and 7) at an angle 11 of about 45°. The term "about 45°" means 45° to within reasonable tolerances of fabrication and measurement. The 45° angle may be advantageous in some embodiments, in that it can be particularly well-suited for applications in which an alignment mark location is illuminated with a pair of light sources on opposing sides of the alignment mark location. In other embodiments, the lines 42 may extend at angles other than 45° relative to the first and second directions (represented by the axes 5 and 7).

The lines and spaces 42 and 44 are on a pitch "$P_3$", which may be referred to as a third pitch. The lines and spaces 42 and 44 may all be on a substantially uniform pitch (as shown) in some embodiments, and in other embodiments some of the lines and spaces 42 and 44 may be on a different pitch than others of the lines and spaces 42 and 44. The third pitch $P_3$ may be substantially the same as the first and second pitches $P_1$ and $P_2$ (FIGS. 4 and 5) in some embodiments, and may be different than one or both of the pitches $P_1$ and $P_2$ in other embodiments. In some embodiments, the first and second pitches $P_1$ and $P_2$ may be substantially the same as one another, and the third pitch $P_3$ may be at least about 1.5 times greater than the first and second pitches. It may be advantageous to form the third pitch to be larger than the first and second pitches as it is generally easier to form lines on a larger pitch than it is to form lines on a narrower pitch, and generally the advantages of the texture 40 may be achieved with a third pitch greater than the first and second pitches $P_1$ and $P_2$. Of course, if it is found to be advantageous to form the third pitch to be narrower, the third pitch $P_3$ may be the same as the first and second $P_1$ and $P_2$, or may even be smaller than the first and second pitches.

In the illustrated embodiment of FIG. 6, the texture 40 may be formed during formation of the first alignment marks 18. Specifically, a reticle may be provided which is configured to simultaneously pattern the texture 40 and the alignment marks 18 within a material across the alignment mark location 16. In the shown embodiment, the texture 40 does not extend across the alignment marks 18. In other embodiments, the texture 40 may extend across at least some regions of at least some of the alignment marks 18.

Referring to FIG. 7, the alignment mark location 16 is shown at a process stage analogous to that of FIG. 3; but using the configuration of FIG. 6 instead of that of FIG. 4. Specifically, the marks and texture of FIG. 7 may result from overlay of the alignment marks from FIG. 5 with the marks and texture from FIG. 6 (as is diagrammatically indicated along the right of FIG. 7). The configuration of FIG. 7 comprises the texture 40 extending across regions of the alignment mark location 16.

FIG. 8 shows a portion of the texture 40, and shows the lines 42 and spaces 44 on the pitch $P_3$. The lines 42 may be formed within any suitable material. In some embodiments, the lines 42 may extend into masking material (e.g., photoresist), conductive material (e.g., metal), insulative material (e.g., silicon dioxide) and/or semiconductor material (e.g., silicon).

In the illustrated embodiment of FIG. 7, the texture 40 extends entirely across expanses between the alignment marks 18 and 20, and is not superimposed over any of the alignment marks. In other embodiments, the texture 40 may be superimposed over some of the alignment marks. An example of such other embodiments is described with reference to FIGS. 9 and 10.

FIG. 9 shows the construction 10 with alignment mark location 16 having only portions formed during the second process step "A" which was described above with reference to FIG. 3 (i.e., analogous to the view utilized above in FIG. 5). In actual applications in which process stages "A" and "B" are compared with the alignment marks 18 and 20 of FIG. 3, the construction of FIG. 9 would not occur. Instead, the alignment marks 18 would be present, together with any other patterns formed across the alignment mark location 16 at the earlier process stage "B". However, the illustration of FIG. 9 is provided to show patterns formed during process stage "A" in isolation from those formed at the earlier process stage "B" in order to assist the reader in understanding which patterns are formed at process stage "A", and which are formed at the earlier process stage "B".

The construction 10 of FIG. 9 has the texture 40 formed across the alignment mark location 16, and between the alignment marks 20. The texture 40 of FIG. 9 may comprise any of the configurations described above relative to FIG. 6; and in the shown embodiment has the pattern of lines 42 and spaces 44 (only some of which are labeled). The lines and spaces 42 and 44 of FIG. 9 may be referred to as third lines and third spaces, respectively, in some embodiments; and the pattern 40 of FIG. 9 may be referred to as a third pattern.

In other embodiments, the pattern 40 of FIG. 9 may be referred to as a second pattern; and in such embodiments the lines and spaces 42 and 44 of FIG. 9 may be referred to as second lines and spaces.

The lines and spaces 42 and 44 of FIG. 9 are on the pitch "$P_3$" described above with reference to FIG. 6.

In the illustrated embodiment of FIG. 9, the texture 40 may be formed during formation of the second alignment marks 20. Specifically, a reticle may be provided which is configured to simultaneously pattern the texture 40 and the alignment marks 20 within a material across the alignment mark location 16. In the shown embodiment, the texture 40 does not extend across the alignment marks 20. In other embodiments, the texture 40 may extend across at least some regions of at least some of the alignment marks 20.

Figure 10:
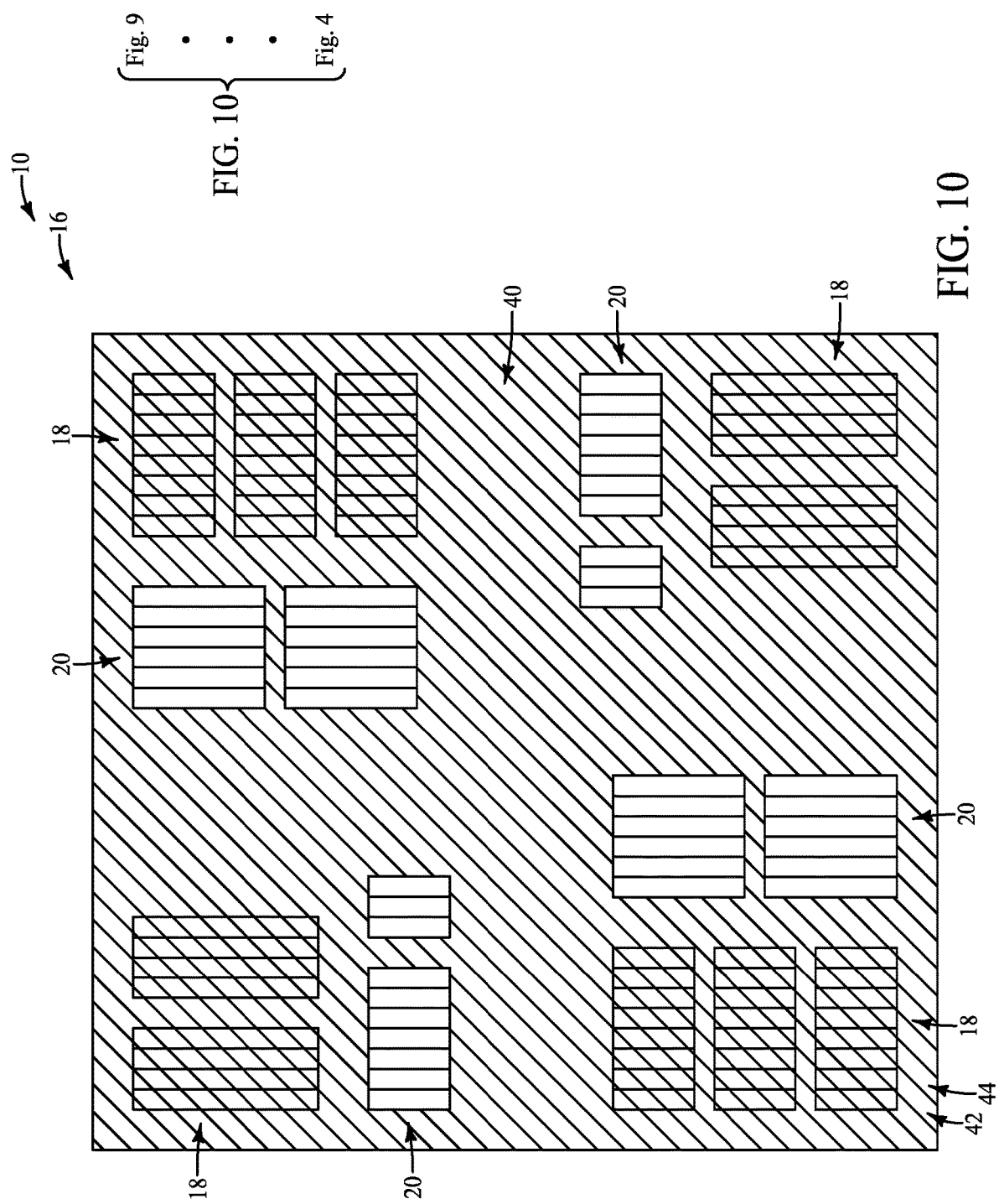
FIG. 10 is a diagrammatic top-down view of an alignment mark location associated with a semiconductor wafer. A description adjacent the alignment mark location diagrammatically indicates that the marks and texture of FIG. 10 may result from the overlay of alignment marks and texture from FIG. 9 with the alignment marks of FIG. 4.

Referring to FIG. 10, the alignment mark location 16 is shown at a process stage analogous to that of FIG. 3; but using the configuration of FIG. 9 instead of that of FIG. 5. Specifically, the marks and texture of FIG. 10 may result from overlay of the alignment marks and texture from FIG. 9 with the alignment marks from FIG. 4 (as is diagrammatically indicated along the right of FIG. 10).

In some embodiments, the configuration of FIG. 10 may be considered to comprise the alignment marks 20 associated with process stage "A" formed adjacent the alignment marks 18 associated with the process stage "B". The pattern 40 has been formed together with the alignment marks 20, and extends across the alignment marks 18. In other embodiments (not shown), the pattern 40 formed with the alignment marks 20 may be configured to be around the alignment marks 18 rather than being superimposed onto the alignment marks 18. Such other embodiments may form a construction substantially identical to the construction of FIG. 7. However, an advantage of utilizing a pattern 40 with lines extending at a 45° angle relative to the first and second directions of axes 5 and 7 is that the pattern is found to not adversely interfere with the reading of alignment marks superimposed under the pattern during a process of ascertaining registration of two or more sets of marks.

The pattern 40 of FIG. 10 is superimposed on the first alignment marks 18, and extends entirely across regions between the first alignment marks (except that the pattern is not superimposed on the second alignment marks 20). In other embodiments, the pattern 40 may be primarily superimposed on the first alignment marks, and may be generally not within regions between the first alignment marks. An example of such other embodiments is described with reference to FIGS. 11 and 12.

Figure 11:
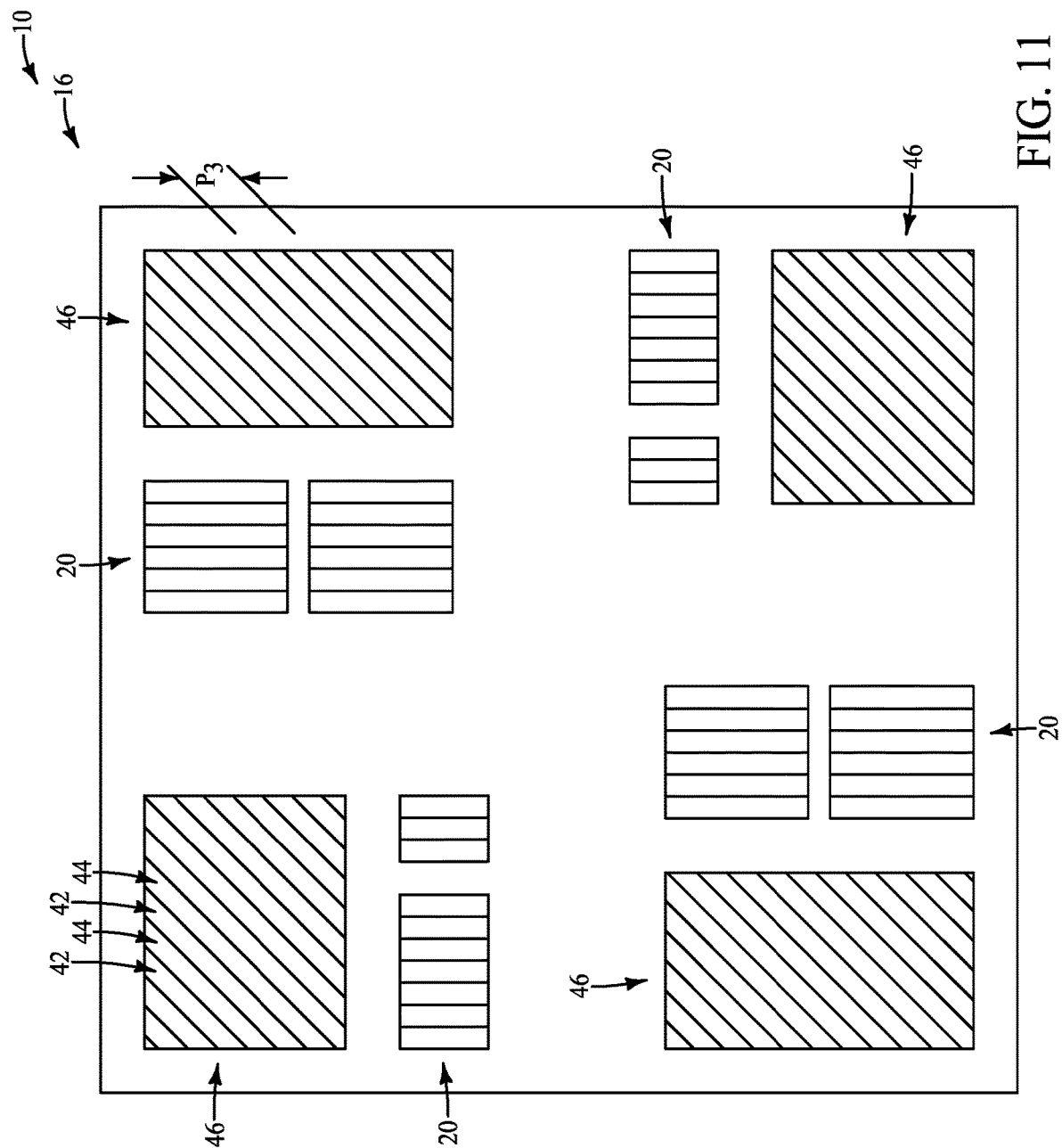
FIG. 11 is a diagrammatic top-down view of an alignment mark location associated with a semiconductor wafer, and illustrates example alignment marks and an example texture.

FIG. 11 shows the construction 10 having the alignment mark location 16 with only portions formed during the second process step "A" (analogous to the illustration of FIG. 9). In actual applications, the construction of FIG. 11 would not occur for reasons analogous to those discussed above with reference to FIG. 9 (specifically process stage "A" occurs after process stage "B" and thus does not exist in isolation from process stage "B"). However, the illustration of FIG. 11 is provided to show patterns formed during process stage "A" in isolation from those formed at the earlier process stage "B" in order to assist the reader in understanding which patterns are formed at process stage "A", and which are formed at the earlier process stage "B".

Figure 12:
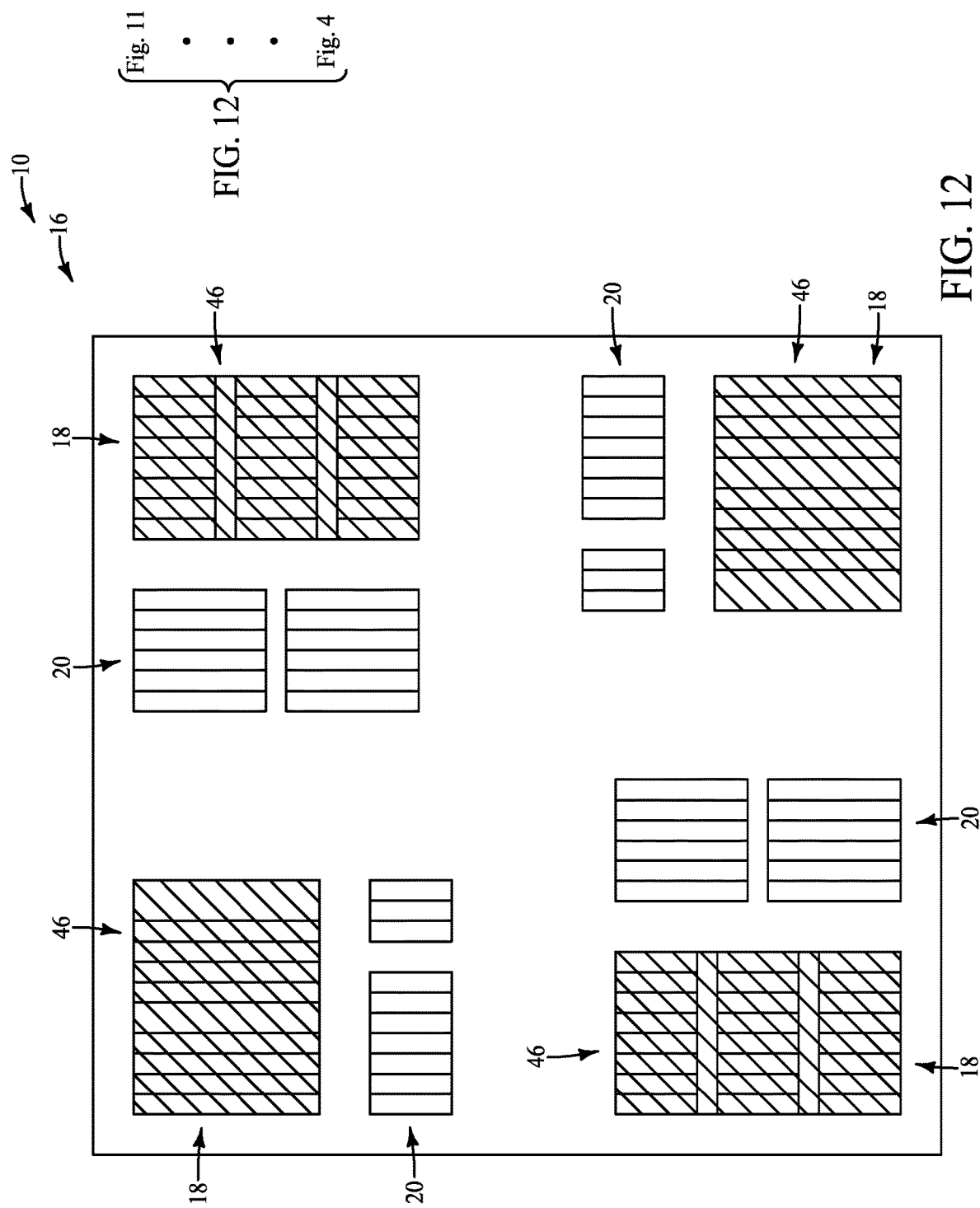
FIG. 12 is a diagrammatic top-down view of an alignment mark location associated with a semiconductor wafer. A description adjacent the alignment mark location diagrammatically indicates that the marks and texture of FIG. 12 may result from the overlay of alignment marks and texture from FIG. 11 with the alignment marks of FIG. 4.

The construction 10 of FIG. 11 has the texture 40 formed in pads 46 which are configured to be superimposed on the alignment marks 18 (as shown in FIG. 12). The texture 40 of FIG. 11 may comprise any of the configurations described above relative to FIG. 6; and in the shown embodiment has the pattern of lines 42 and spaces 44 (only some of which are labeled). The lines and spaces 42 and 44 of FIG. 11 may be referred to as third lines and third spaces, respectively, in some embodiments; and the pattern 40 of FIG. 11 may be referred to as a third pattern. In other embodiments, the pattern 40 of FIG. 11 may be referred to as a second pattern; and in such embodiments the lines and spaces 42 and 44 of FIG. 11 may be referred to as second lines and spaces.

The lines and spaces 42 and 44 of FIG. 11 are on the pitch "$P_3$" described above with reference to FIG. 6.

In the illustrated embodiment of FIG. 11, the texture 40 may be formed during formation of the second alignment marks 20. Specifically, a reticle may be provided which is configured to simultaneously pattern the texture 40 and the alignment marks 20 within a material across the alignment mark location 16. In the shown embodiment, the texture 40 does not extend across the alignment marks 20. In other embodiments, the texture 40 may extend across at least some regions of at least some of the alignment marks 20.

Referring to FIG. 12, the alignment mark location 16 is shown at a process stage analogous to that of FIG. 3; but using the configuration of FIG. 11 instead of that of FIG. 5. Specifically, the marks and texture of FIG. 12 may result from overlay of the alignment marks and texture from FIG. 11 with the alignment marks from FIG. 4 (as is diagrammatically indicated along the right of FIG. 12).

In some embodiments, the configuration of FIG. 12 may be considered to comprise the alignment marks 20 associated with process stage "A" formed adjacent the alignment marks 18 associated with the process stage "B". The pattern 40 has been formed together with the alignment marks 20, and is superimposed on the alignment marks 18.

It is noted that a configuration analogous to that of FIG. 12 may result from other processing. For instance, the pattern 40 may be superimposed over the alignment marks 18 at the process stage "B" of FIG. 3 (i.e., a process stage analogous to that of FIG. 4), and then the alignment marks 20 may be formed at the subsequent process stage "A" (in such embodiments, the pattern formed at process stage "A" may look like that of FIG. 5 if the pattern were to be viewed in isolation from the pattern formed at process stage "B").

In some embodiments, either of the patterns 40 of FIGS. 10 and 12 could be formed at a process stage prior to the process stage "B" of FIG. 3, and then the alignment marks 18 could be formed at the process stage "B". For instance, the alignment marks 18 could be formed to comprise trenches extending into the pattern 40.

In some embodiments, the pattern 40 may be formed at a process stage which is intermediate the process stages "B" and "A" of FIG. 3. Examples of such embodiments are described with reference to FIGS. 13-16.

FIG. 13 shows the construction 10 with alignment mark location 16 having only portions formed during the intermediate process step between the steps "B" and "A". In actual applications, the construction of FIG. 13 would not occur (instead, the alignment marks 18 would be present, together with any other patterns formed across the alignment mark location 16 at the earlier process stage "B"). However, the illustration of FIG. 13 is provided to show the intermediate process stage in isolation from the earlier process stage "B" in order to assist the reader in understanding which patterns are formed at the intermediate process stage.

The construction 10 of FIG. 13 has the texture 40 formed across the alignment mark location 16. The texture 40 of FIG. 13 may comprise any of the configurations described above relative to FIG. 6; and in the shown embodiment has the pattern of lines 42 and spaces 44 (only some of which are labeled). The lines and spaces 42 and 44 of FIG. 13 may be referred to as third lines and third spaces, respectively, in some embodiments; and the pattern 40 of FIG. 13 may be referred to as a third pattern. In other embodiments, the pattern 40 of FIG. 13 may be referred to as a second pattern; and in such embodiments the lines and spaces 42 and 44 of FIG. 13 may be referred to as second lines and spaces.

The lines and spaces 42 and 44 of FIG. 13 are on the pitch "$P_3$" described above with reference to FIG. 6.

In the illustrated embodiment of FIG. 13, the texture 40 extends entirely across the alignment mark location 16. In other embodiments, the texture 40 may be formed to only extend across portions of the alignment mark location 16. For instance, the texture 40 may be patterned so that windows extend through the pattern 40 to the alignment marks 18 of the first process stage so that the texture 40 is not superimposed on the alignment marks 18. As another example, the texture 40 may be patterned so that the texture is not across regions which will ultimately be incorporated into the second alignment marks 20.

Figure 14:
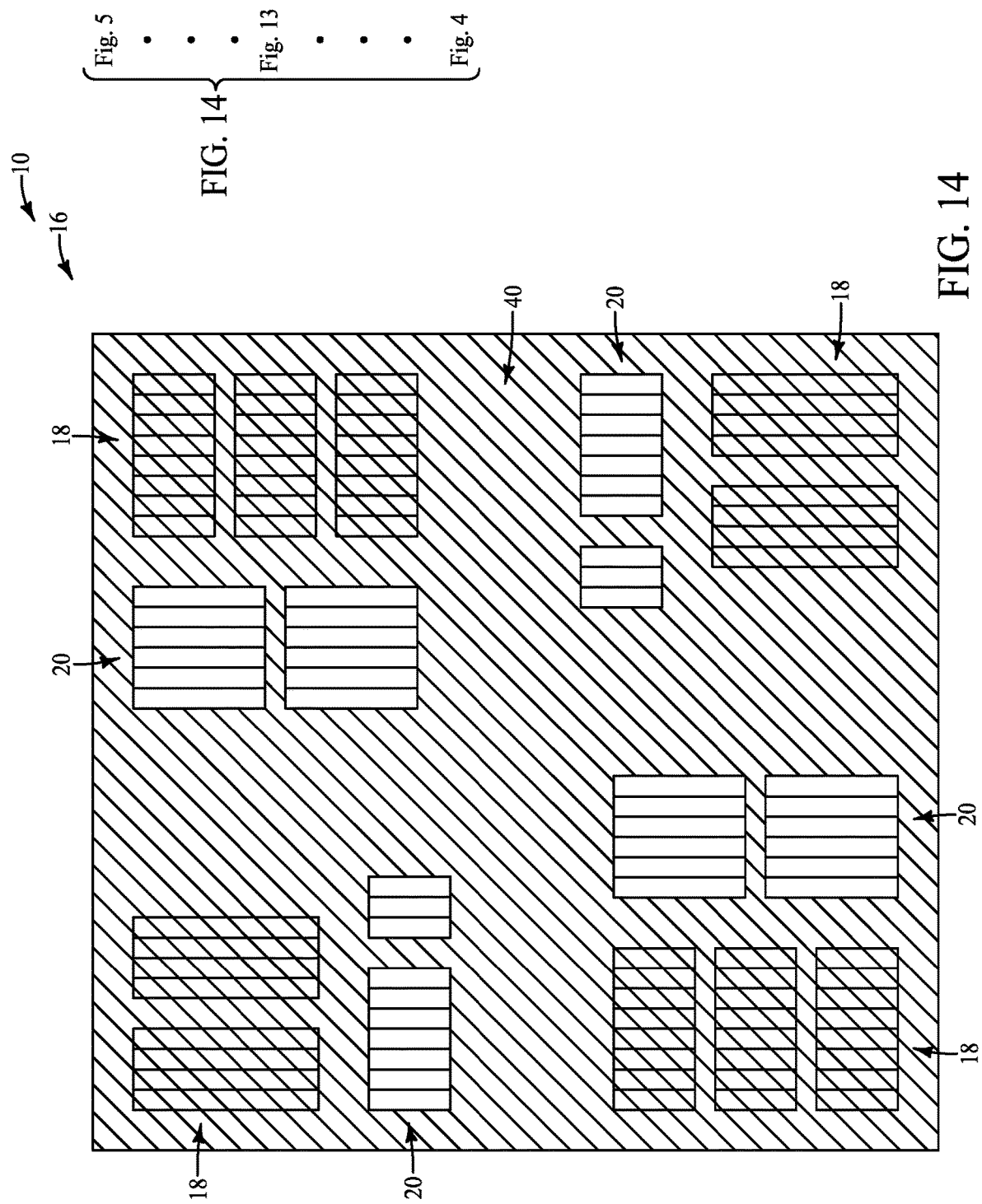
FIG. 14 is a diagrammatic top-down view of an alignment mark location associated with a semiconductor wafer. A description adjacent the alignment mark location diagrammatically indicates that the marks and texture of FIG. 14 may result from the overlay of alignment marks of FIG. 5 with the texture from FIG. 13, and with the alignment marks of FIG. 4.

Referring to FIG. 14, the alignment mark location 16 is shown at a process stage analogous to that of FIG. 3; but using the configuration of FIG. 13 provided at an intermediate process stage between the configurations of FIGS. 4 and 5. Specifically, the marks and texture of FIG. 14 may result from overlay of the alignment marks of FIG. 5 with the texture of FIG. 13 and the alignment marks of FIG. 4 (as is diagrammatically indicated along the right of FIG. 14).

In some embodiments, the configuration of FIG. 14 may be considered to comprise the alignment marks 20 associated with process stage "A" formed adjacent the alignment marks 18 associated with the process stage "B". The pattern 40 formed at the intermediate process stage (FIG. 13) extends across the alignment marks 18. In other embodiments (not shown), the pattern 40 may be configured to be around the alignment marks 18 rather than being superimposed onto the alignment marks 18. In the shown embodiment, the alignment marks 20 associated with the second process stage "A" are not affected by the pattern 40 (e.g., the pattern 40 may be exhumed from regions where the alignment marks 20 are formed). In other embodiments, the alignment marks 20 may comprise trenches formed into the pattern 40 and thus the pattern 40 may extend across at least some regions of the alignment marks 20.

The pattern 40 of FIG. 13 is an example of a pattern which may be formed at an intermediate level (i.e., a level between the level of process stage "B" and the level of process stage "A"). In some embodiments, multiple intermediate levels may provide patterns which ultimately combine to form an overall pattern which extends across at least a portion of an alignment mark location. For instance, FIG. 15 shows the construction 10 with alignment mark location 16 having a pattern formed at another intermediate level besides that of FIG. 13. In actual applications, the construction of FIG. 15 would not occur (instead, the alignment marks 18 would be present, together with any other patterns formed across the alignment mark location 16 at the earlier process stage "B"). However, the illustration of FIG. 15 is provided to show the intermediate process stage in isolation from the earlier process stage "B" in order to assist the reader in understanding which patterns are formed at the intermediate process stage.

The construction 10 of FIG. 15 has a second texture 50 formed across the alignment mark location 16. The texture 50 of FIG. 15 may comprise any of the configurations described above relative to FIG. 6; and in the shown embodiment has a pattern of lines 52 and spaces 54 (only some of which are labeled). The lines and spaces 52 and 54 of FIG. 15 may be referred to as fourth lines and fourth spaces, respectively, in some embodiments; and the pattern 50 of FIG. 15 may be referred to as a fourth pattern. The fourth lines 52 extend along a fourth direction (represented by an axis 53 which is substantially orthogonal to the third direction (represented by the axis 9); and which crosses the first and second directions (represented by the axes 5 and 7) at an angle of about 45°.

The lines and spaces 52 and 54 of FIG. 15 are on the pitch "$P_3$" described above with reference to FIG. 6. In other embodiments, the lines and spaces 52 and 54 may be on a pitch different from the pitch $P_3$.

In the illustrated embodiment of FIG. 15, the texture 50 extends entirely across the alignment mark location 16. In other embodiments, the texture 50 may be formed to only extend across portions of the alignment mark location 16. For instance, the texture 50 may be patterned so that windows extend through the pattern 50 to the alignment marks 18 of the first process stage so that the texture 50 is not superimposed on the alignment marks 18. As another example, the texture 50 may be patterned so that the texture is not across regions which will ultimately be incorporated into the second alignment marks 20.

Figure 16:
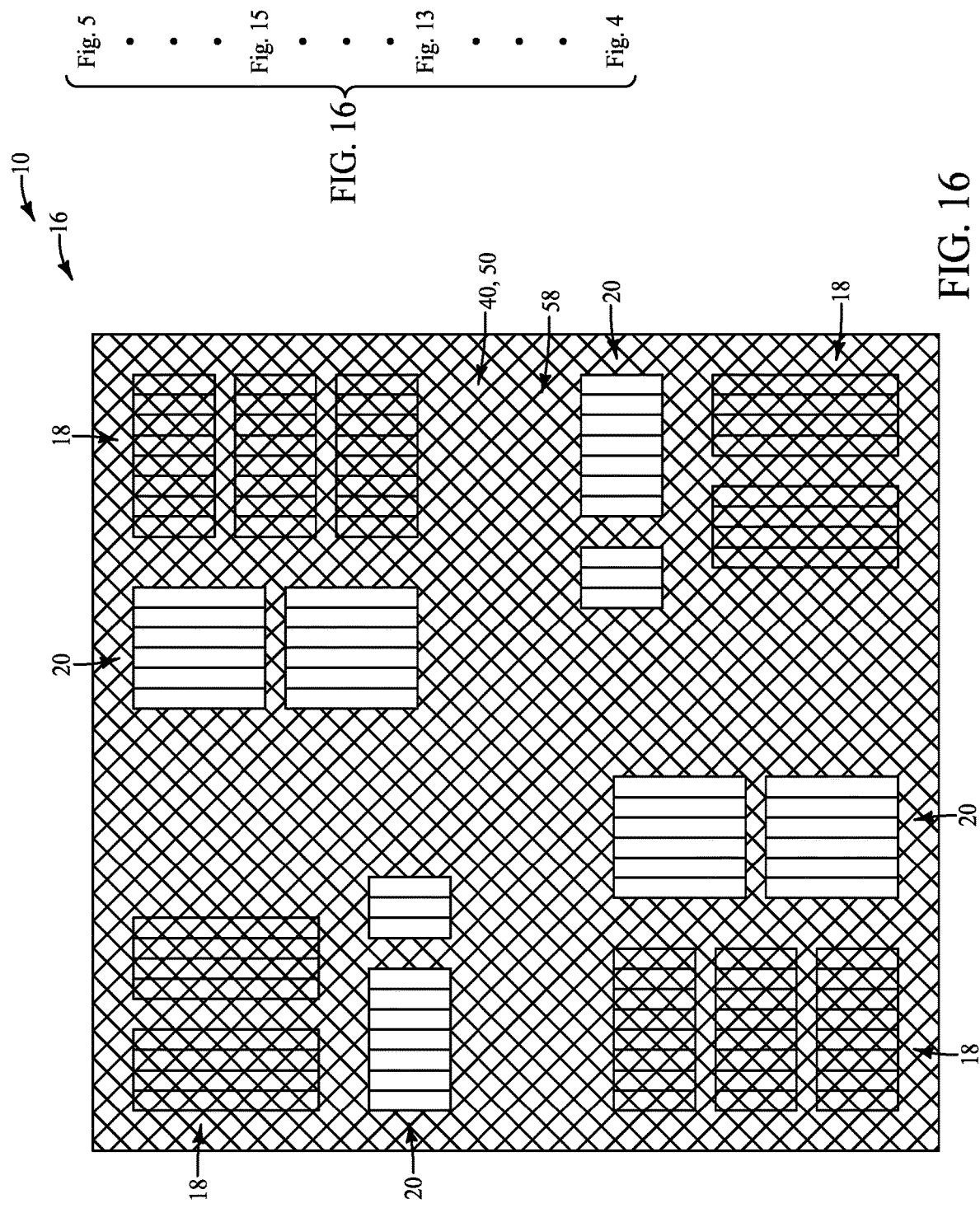
FIG. 16 is a diagrammatic top-down view of an alignment mark location associated with a semiconductor wafer. A description adjacent the alignment mark location diagrammatically indicates that the marks and texture of FIG. 16 may result from the overlay of alignment marks of FIG. 5 with the textures from FIGS. 13 and 15, and with the alignment marks of FIG. 4.

Referring to FIG. 16, the alignment mark location 16 is shown at a process stage analogous to that of FIG. 3; but using the configurations of FIGS. 13 and 15 provided at intermediate process stages between the configurations of FIGS. 4 and 5. Specifically, the marks and texture of FIG. 16 may result from overlay of the alignment marks of FIG. 5 with the textures of FIGS. 13 and 15, and with the alignment marks of FIG. 4 (as is diagrammatically indicated along the right of FIG. 16).

The configuration of FIG. 16 may be considered to comprise the alignment marks 20 associated with process stage "A" formed adjacent the alignment marks 18 associated with the process stage "B". The patterns 40 and 50 formed at the intermediate process stages (FIGS. 13 and 15) extend across the alignment marks 18. In other embodiments (not shown), the patterns 40 and 50 may be configured to be around the alignment marks 18 rather than being superimposed onto the alignment marks 18. In the shown embodiment, the alignment marks 20 associated with the second process stage "A" are not affected by the patterns 40 and 50 (e.g., the patterns 40 and 50 may be exhumed from regions where the alignment marks 20 are formed). In other embodiments, the patterns 40 and 50 may extend across regions of the alignment marks 20.

The patterns 40 and 50 combine together to form a pattern 58. Although the pattern 58 is described as being formed by the combination of two different patterns from two different intermediate steps, in other embodiments the pattern 58 may be formed with a single intermediate step by configuring a reticle to impose the pattern 58 on a material associated with the alignment mark location 16 of construction 10. It is noted that a pattern analogous to pattern 58 may be substituted for any of the patterns 40 describe relative to the embodiments of FIGS. 6-12.

Figure 17:
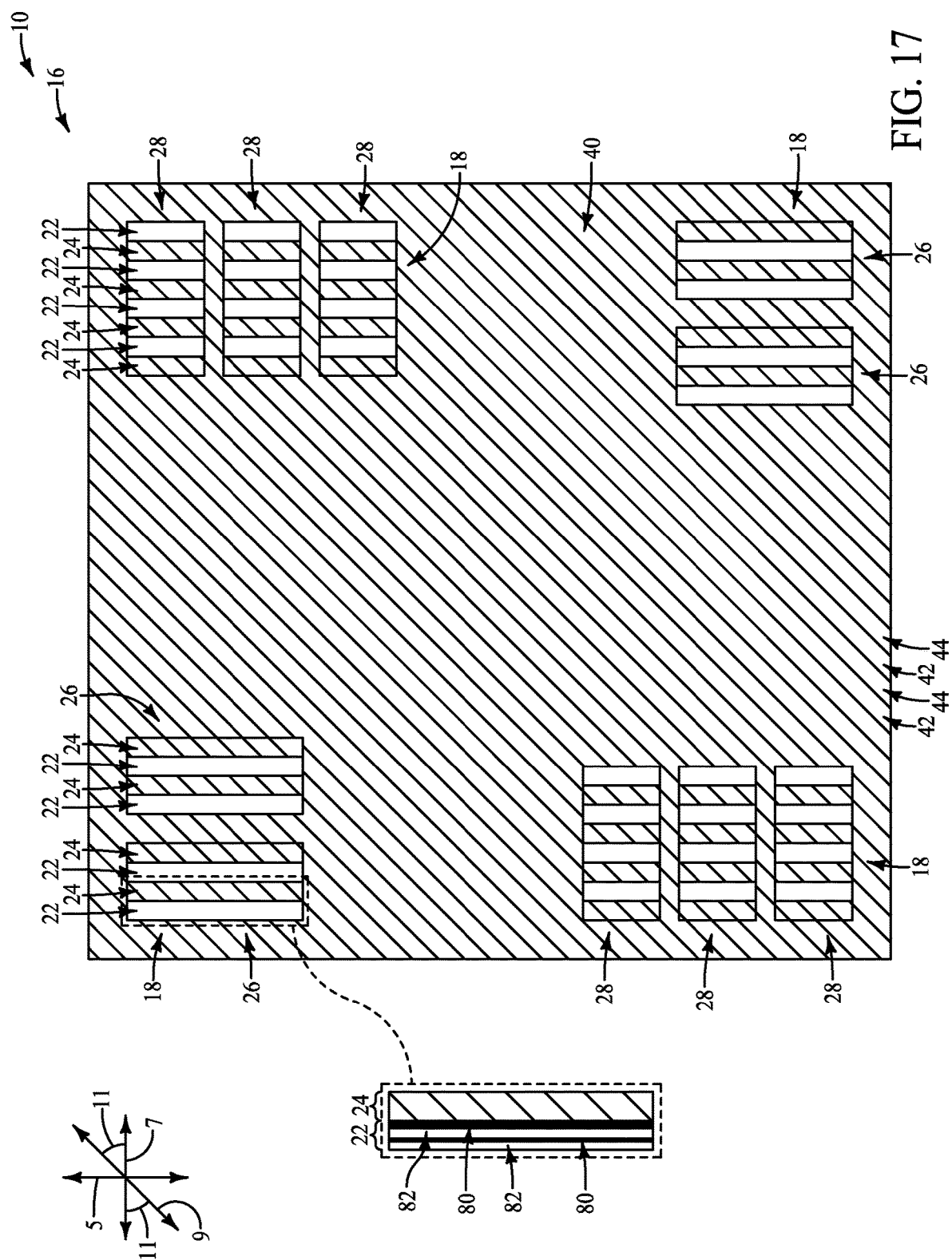
FIG. 17 is a diagrammatic top-down view of an alignment mark location associated with a semiconductor wafer, and illustrates example alignment marks and an example texture.

In some embodiments, regions of the pattern 40 may extend within spaces of an alignment mark location. For instance, FIG. 17 shows the alignment mark location 16 at a process stage analogous to that described above with reference to FIG. 6. However, the texture 40 extends across the spaces 24 within the alignment marks 18. FIG. 17 also shows an expanded region of one of the lines 22 to indicate that each of the "lines" 22 may be subdivided amongst bars 80 which are spaced from one another by spaces 82. The bars 80 may or may not be about a same width as one another; and similarly, the spaces 82 may or may not be about a same width as one another. The bars 80 may be present along any of the lines 22 described with reference to any of the figures provided herein, and similar bars may be present along any of the lines 30 (e.g., FIG. 5) described herein.

FIG. 18 shows the alignment mark location 16 at a process stage analogous to that of FIG. 7; but using the configuration of FIG. 17 instead of that of FIG. 6. Specifically, the marks and texture of FIG. 18 may result from overlay of the alignment marks from FIG. 5 with the marks and texture from FIG. 17 (as is diagrammatically indicated along the right of FIG. 18). FIGS. 17 and 18 show the texture 40 extending across spaces within alignment marks 18 of the type described above with reference to FIG. 4. In analogous processing, the texture 40 may additionally, or alternatively, extend across spaces within alignment marks 20 of the type described above with reference to FIG. 5.

Figure 19:
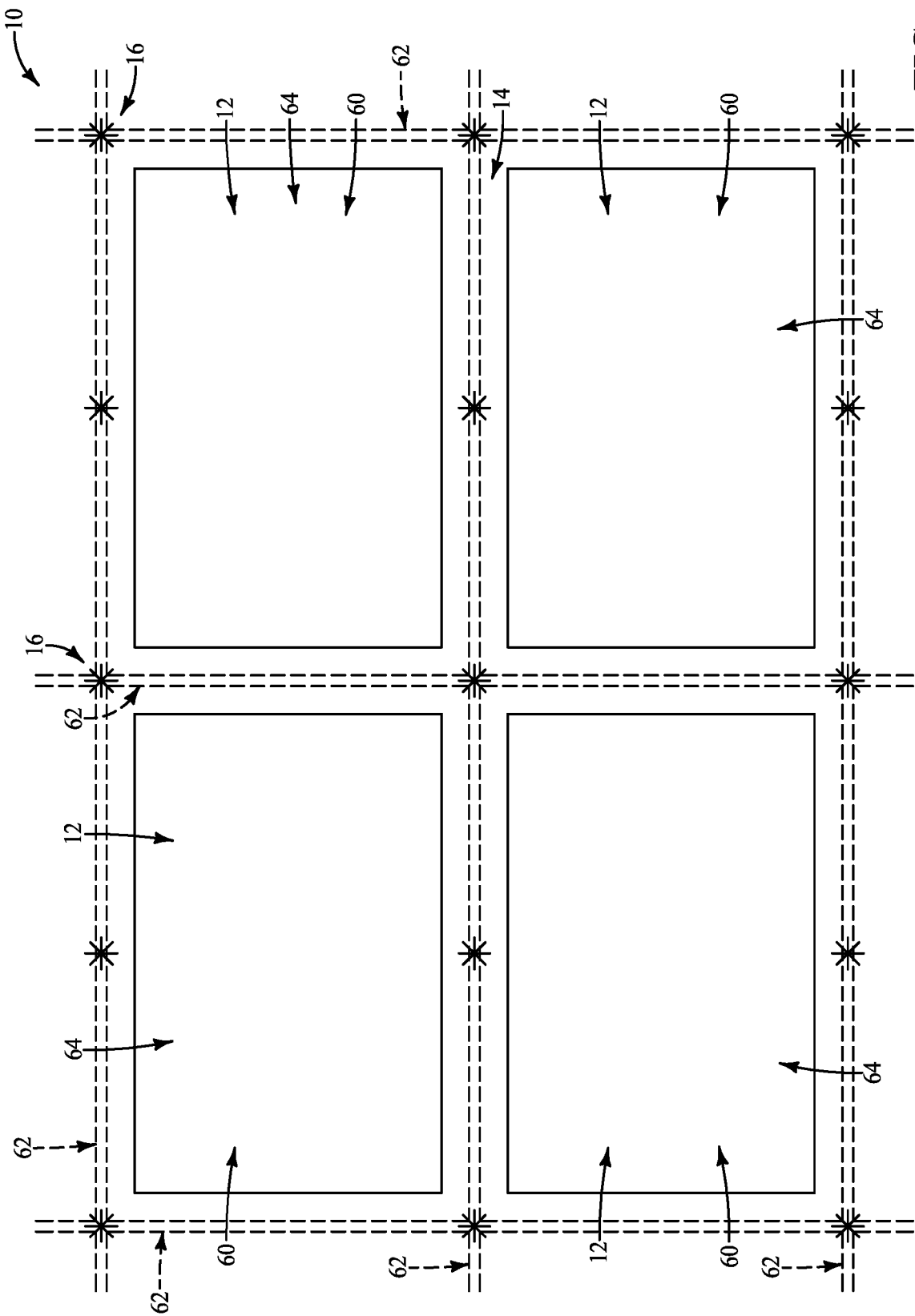
FIG. 19 is a diagrammatic top-down view of a region of the semiconductor wafer of FIG. 1 showing cut locations utilized to singulate dies from the wafer.

Referring to FIG. 19, integrated circuitry 60 (e.g., circuitry of integrated memory, integrated logic, integrated sensors, etc.) is eventually fabricated in the die locations 12. Subsequently, the wafer 10 is sliced along the intervening regions 14 to separate finished dies from one another, and to thereby singulate the dies. FIG. 19 diagrammatically illustrates kerfs 62 to indicate cutting utilized to separate the dies from one another.

In the shown embodiment of FIG. 19, the kerfs extend through the alignment mark locations 16. The kerfs may be thinner than the alignment mark locations (as shown), and accordingly portions of the alignment mark locations may remain adjacent the die configurations after the singulation. The remaining portions of the alignment mark locations may comprise portions of the alignment marks 18 and 20 of any of the embodiments of FIGS. 6-18 discussed above, and portions of any of the textures (e.g., textures 40, 50 and 58) described above relative to the embodiments of FIGS. 6-18.

Figure 20:
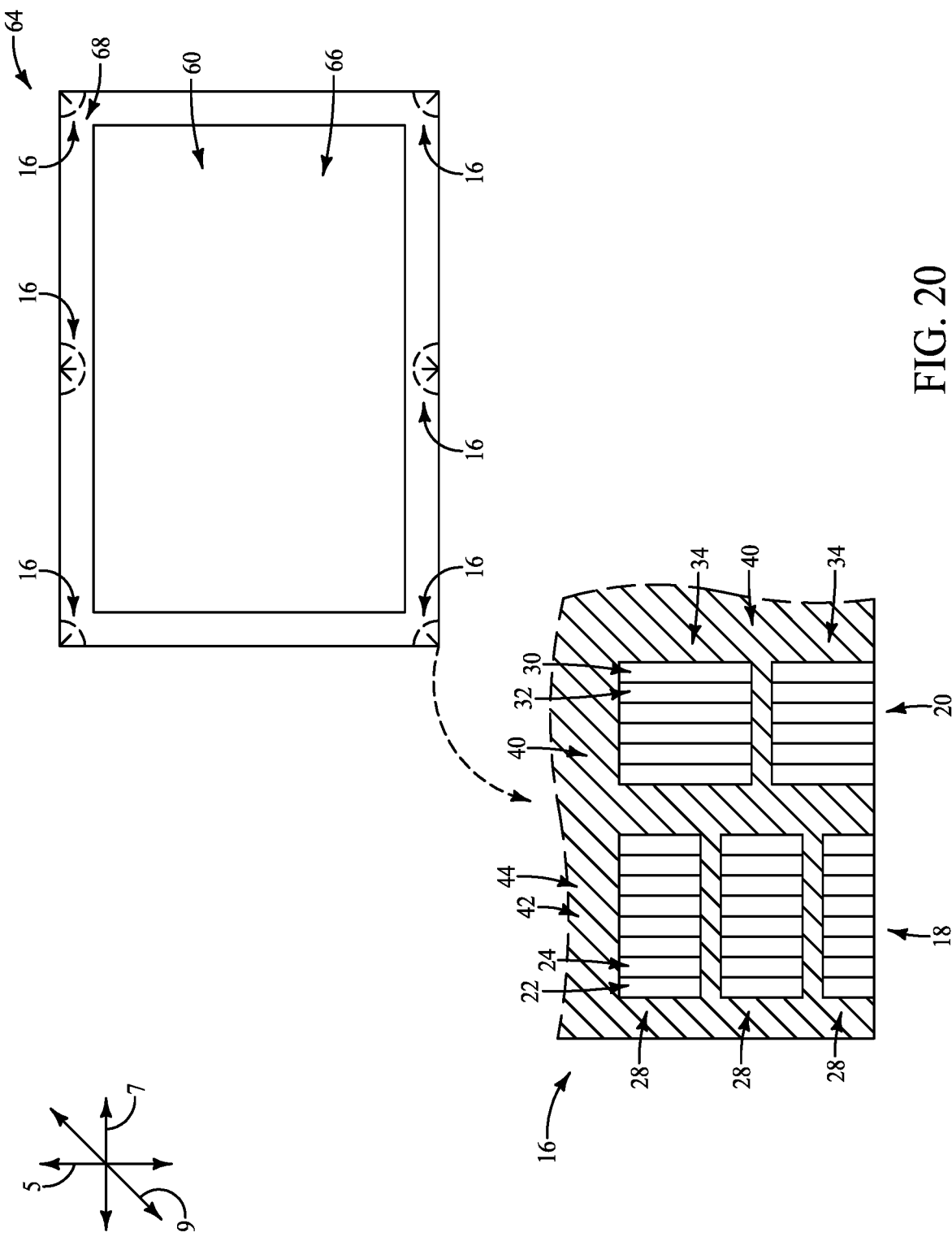
FIG. 20 is a diagrammatic top-down view of a singulated die cut from the wafer of FIG. 19, and shows an expanded region illustrating a portion of an alignment mark location.

Each finished die is part of a die configuration 64. FIG. 20 shows a die configuration 64, and shows that such die configuration has a primary region 66 comprising the integrated circuitry 60, and has an edge region 68 surrounding the primary region 66. The edge region 68 includes part of the intervening region 14 (FIG. 19), and such part includes portions of the alignment mark locations 16.

An enlarged view of one of the portions of an alignment mark location 16 is shown in FIG. 20. Such portion includes segments 28 of an alignment mark 18, and segments 34 of an alignment mark 20. The segments 28 include the lines and spaces 22 and 24 (only a couple of which are labeled); and the segments 34 include the lines and spaces 30 and 32 (only a couple of which are labeled). The segments 28 and 34 extend along the first and second directions represented by the axes 5 and 7. The alignment mark location 16 also includes the texture 40. In the illustrated embodiment, the texture 40 comprises the lines and spaces 42 and 44 (only a couple of which are labeled) extending along the third direction represented by the axis 9. The illustrated texture 40 is an example texture, and any of the textures described above with reference to FIGS. 6-16 (e.g., the textures 40, 50 and 58) may be present within the alignment mark locations 16 at the processing stage of FIG. 20.

Figure 21:
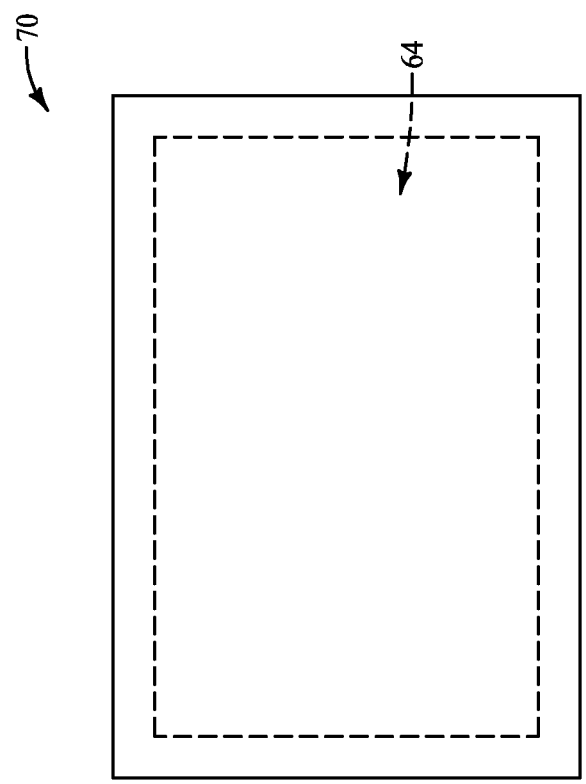
FIG. 21 is a diagrammatic top-down view of the singulated die of FIG. 20 incorporated into a package.

The die configuration 64 of FIG. 20 may be incorporated into a semiconductor package 70 as shown in FIG. 21. The package 70 may comprise encapsulation material over the die configuration 64, and accordingly the die configuration is shown in dashed-line (i.e., phantom) view in order to indicate that the die configuration may be under other materials. The package 70 may include pins, pads, wires, etc. (not shown) for electrically coupling circuitry of the die configuration 64 with circuitry external of the package 70. Although the semiconductor package 70 is shown comprising only a single die, in other embodiments individual semiconductor packages may comprise multiple dies.

The assemblies and structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

Some embodiments include a method for alignment marking a semiconductor wafer. Die locations are defined to be associated with the semiconductor wafer, and alignment mark locations are defined to be between the die locations. First alignment marks are formed within the alignment mark locations at a first level of processing associated with the semiconductor wafer. The first alignment marks include first segments extending primarily along a first direction, and include second segments extending primarily along a second direction substantially orthogonal to the first direction. Second alignment marks are formed within the alignment mark locations at a second level of processing associated with the semiconductor wafer. The second level of processing is subsequent to the first level of processing. The second alignment marks include third segments extending primarily along the first direction, and include fourth segments extending primarily along the second direction. A texture is formed within the alignment mark locations. The texture has a pattern other than lines extending along either the first or second direction.

Some embodiments include a method for alignment marking a semiconductor wafer. Die locations are defined to be associated with the semiconductor wafer, and alignment mark locations are defined to be between the die locations. First alignment marks are formed within the alignment mark locations at a first level of processing associated with the semiconductor wafer. The first alignment marks have a first pattern of first lines and first spaces, with the first lines extending primarily along a first direction. The first pattern of first lines and first spaces is configured within first segments extending primarily along a first direction, and within second segments extending primarily along a second direction substantially orthogonal to the first direction. Second alignment marks are formed within the alignment mark locations at a second level of processing associated with the semiconductor wafer. The second level of processing is subsequent to the first level of processing. The second alignment marks have a second pattern of second lines and second spaces, with the second lines extending primarily along the first direction. The second alignment marks comprise third segments extending primarily along the first direction, and comprise fourth segments extending primarily along the second direction. A texture is formed to have a third pattern of third lines and third spaces within the alignment mark locations. The third lines extend along a third direction which crosses the first and second directions. The texture may be formed during the formation of the first alignment marks, during the formation of the second alignment marks, and/or at an intermediate level of processing between the first and second levels of processing.

Some embodiments include a semiconductor package having a semiconductor die with a primary region which includes integrated circuitry, and with an edge region which includes a portion of an alignment mark location. The portion of the alignment mark location includes a segment of an alignment mark. The alignment mark includes a pattern of lines and spaces, with the lines extending along a first direction. The portion of the alignment mark location also includes a texture having a pattern other than lines extending along either the first direction or a second direction substantially orthogonal to the first direction. In some embodiments, the segment may extend along either the first direction, or along the second direction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method for alignment marking a semiconductor wafer, comprising:
   providing a semiconductor wafer having die locations spaced from one another by intervening regions;
   forming first alignment marks within the intervening regions at first level of processing associated with the semiconductor wafer; the first alignment marks comprising first segments extending primarily along a first direction, and comprising second segments extending primarily along a second direction substantially orthogonal to the first direction;
   forming second alignment marks within the intervening regions at a second level of processing associated with the semiconductor wafer; the second alignment marks comprising third segments extending primarily along the first direction, and comprising fourth segments extending primarily along the second direction; and
   forming a texture within the alignment mark locations, the texture having a pattern of features extending along a third direction that crosses the first and second directions.

2. The method of claim 1 wherein the texture is superimposed on the first alignment marks.

3. The method of claim 1 wherein the texture is primarily superimposed on the first alignment marks and is generally not within regions between the first alignment marks.

4. The method of claim 1 wherein the texture is superimposed on the first alignment marks and extends across regions between the first alignment marks.

5. The method of claim 1 wherein the texture is formed during the formation of the first alignment marks.

6. The method of claim 1 wherein the texture is formed during the formation of the second alignment marks.

7. The method of claim 1 wherein the texture is formed at an intermediate level of processing between the first and second levels.

8. The method of claim 1 wherein the third direction crosses the first and second directions at an angle of about 45°.

9. The method of claim 8 wherein the texture includes a fourth pattern of fourth lines and fourth spaces within the alignment mark locations; and wherein the fourth lines extend along a fourth direction which is substantially orthogonal to the third direction, and which crosses the first and second directions at another angle of about 45°.

10. The method of claim 1 wherein:
the first pattern of first lines and first spaces has a first pitch;
the second pattern of second lines and second spaces has a second pitch which is substantially the same as the first pitch; and
the third pattern of third lines and third spaces has a third pitch which is larger than the first and second pitches.

11. The method of claim 10 wherein the third pitch is at least about 1.5 times greater than the first and second pitches.

12. The method of claim 10 wherein the die locations are spaced from one another by intervening regions; and wherein the alignment mark locations are within the intervening regions.

13. A method for alignment marking a semiconductor wafer, comprising:
defining alignment mark locations between the die locations within the semiconductor wafer;
forming first alignment marks within the alignment mark locations at a first level of processing associated with the semiconductor wafer; the first alignment marks having a first pattern of first lines and first spaces, with the first lines extending primarily along a first direction; the first pattern of first lines and first spaces being configured within first segments extending primarily along a first direction, and within second segments extending primarily along a second direction substantially orthogonal to the first direction; and
forming a texture having a second pattern of second lines and second spaces within the alignment mark locations; the second lines extending along a third direction which crosses the first and second directions.

14. A semiconductor package comprising a semiconductor die having a primary region comprising integrated circuitry and an edge region comprising a portion of an alignment mark location; the portion of the alignment mark location including:
a segment of an alignment mark extending along a first direction; and
a texture having a pattern having features extending along a second direction that crosses the first direction at an angle other than 90 degrees.

15. The semiconductor package of claim 14 wherein the second direction crosses the first direction at an angle of about 45°.

16. The semiconductor package of claim 14 wherein the texture is superimposed on the segment of the alignment mark.

17. The semiconductor package of claim 14 wherein the primary region comprises integrated memory.

18. The semiconductor package of claim 14 wherein the primary region comprises integrated logic.

19. The semiconductor package of claim 14 wherein the primary region comprises integrated sensors.

* * * * *